United States Patent
Kadota

(10) Patent No.: US 8,310,321 B2
(45) Date of Patent: *Nov. 13, 2012

(54) TUNABLE FILTER INCLUDING A VARIABLE CAPACITOR CONNECTED WITH A SURFACE ACOUSTIC WAVE RESONATOR

(75) Inventor: Michio Kadota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/096,019

(22) Filed: Apr. 28, 2011

(65) Prior Publication Data

US 2011/0199168 A1 Aug. 18, 2011

Related U.S. Application Data

(63) Continuation of application No. PCT/JP2009/006198, filed on Nov. 18, 2009.

(30) Foreign Application Priority Data

Nov. 18, 2008 (JP) .................... 2008-294695
Sep. 16, 2009 (JP) .................... 2009-214729

(51) Int. Cl.
*H03H 9/64* (2006.01)
(52) U.S. Cl. ............ 333/195; 333/193; 310/313 A
(58) Field of Classification Search .......... 310/313 B, 310/313 C, 313 D, 313 A; 333/193, 195
See application file for complete search history.

(56) References Cited

U.S. PATENT DOCUMENTS

| 2002/0158708 A1 | 10/2002 | Inoue et al. |
| 2005/0212612 A1 | 9/2005 | Kawakubo et al. |
| 2007/0120439 A1 | 5/2007 | Kadota et al. |

FOREIGN PATENT DOCUMENTS

| JP | 1-277011 A | 11/1989 |
| JP | 06-132760 A | 5/1994 |
| JP | 09-083030 A | 3/1997 |
| JP | 11-274883 A | 10/1999 |
| JP | 2002-330055 A | 11/2002 |
| JP | 2005-217852 A | 8/2005 |
| JP | 2005-348139 A | 12/2005 |
| JP | 2006-270906 A | 10/2006 |
| JP | 2008-054046 A | 3/2008 |
| WO | 2006/011417 A1 | 2/2006 |
| WO | 2008/123131 A1 | 10/2008 |

OTHER PUBLICATIONS

Official Communication issued in International Patent Application No. PCT/JP2009/006198, mailed on Feb. 16, 2010.
Kadota: "Tunable Filter"; U.S. Appl. No. 13/096,026, filed Apr. 28, 2011.
Official Communication issued in corresponding Japanese Patent Application No. 2010-539145, mailed on Jul. 10, 2012.

*Primary Examiner* — Barbara Summons
(74) *Attorney, Agent, or Firm* — Keating & Bennett, LLP

(57) ABSTRACT

A tunable filter includes a circuit configuration in which variable capacitors are connected with surface acoustic wave resonators. The surface acoustic wave resonators each include a piezoelectric substrate made of $LiTaO_3$ or $LiNbO_3$, an IDT electrode made of an electrode material filled in a recess in an upper surface of the piezoelectric substrate, and a $SiO_2$ film arranged to cover the piezoelectric substrate.

14 Claims, 30 Drawing Sheets

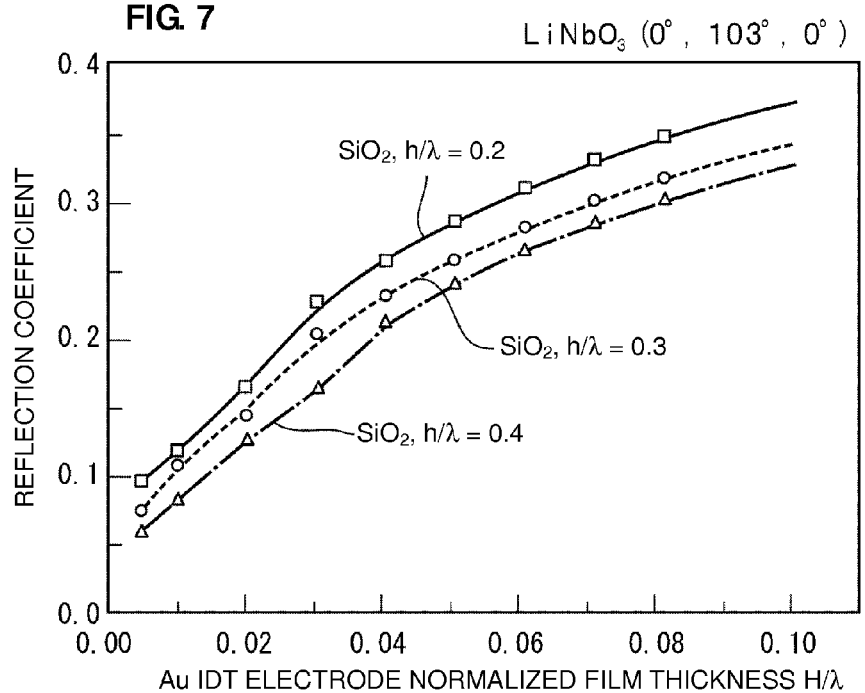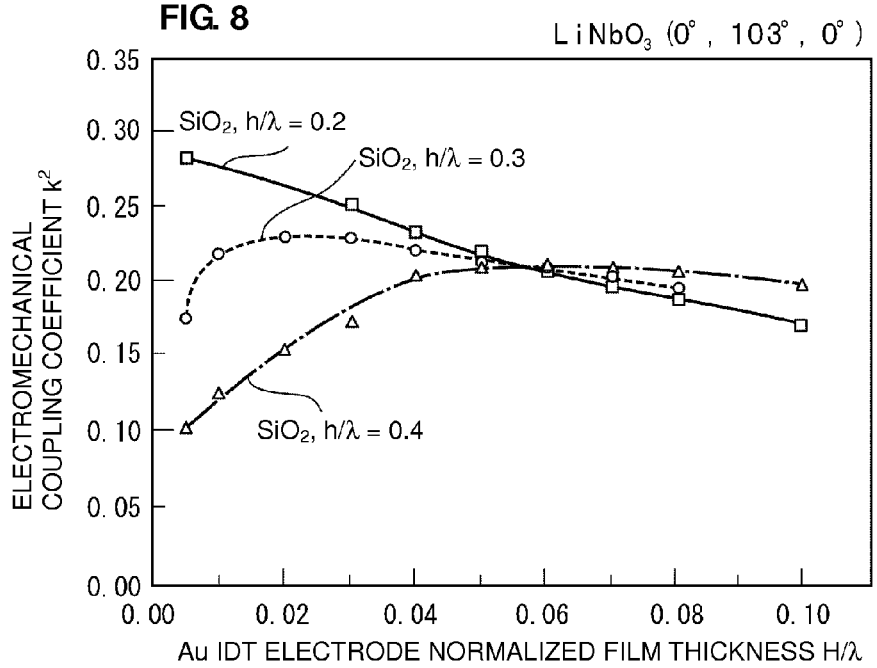

TUNABLE FILTER INCLUDING A VARIABLE CAPACITOR CONNECTED WITH A SURFACE ACOUSTIC WAVE RESONATOR

BACKGROUND OF THE INVENTION

1. Field of the Invention

The present invention relates to a tunable filter preferably for use as a band filter in a communication system, and more particularly, to a tunable filter including a surface acoustic wave resonator.

2. Description of the Related Art

Occasionally, a bandpass filter used in a communication system having an adjustable pass band is required. Various bandpass filters, i.e., tunable filters, that satisfy this requirement have been suggested.

For example, Japanese Unexamined Patent Application Publication No. 2005-217852 discloses a tunable filter that includes a plurality of surface acoustic wave resonators and a plurality of variable capacitors. FIG. 52 is a circuit diagram of the tunable filter described in Japanese Unexamined Patent Application Publication NO. 2005-217852.

In a tunable filter 101, a plurality of series-arm resonators 104 and 105 are connected in series with a series arm that couples an input terminal 102 and an output terminal 103 to each other. In addition, parallel-arm resonators 106 and 107 are respectively connected with a plurality of parallel arms provided between the series arm and a ground potential. The series-arm resonators 104 and 105, and the parallel-arm resonators 106 and 107 are defined by surface acoustic wave resonators.

A ladder filter circuit including the series-arm resonators 104 and 105 and the parallel-arm resonators 106 and 107 is provided. Further, to enable the pass band to be adjusted, variable capacitors 108 to 115 are provided. In particular, the variable capacitor 108 is connected in parallel with the series-arm resonator 104, and the variable capacitor 110 is connected in series with the series-arm resonator 104 and the variable capacitor 108. Similarly, the variable capacitor 109 is connected in parallel with the series-arm resonator 105, and is connected in series with the variable capacitor 111.

The variable capacitor 112 is connected in parallel with the parallel-arm resonator 106, and the variable capacitor 114 is connected in series with the parallel-arm resonator 106 and the variable capacitor 112. Similarly, the variable capacitor 113 is connected in parallel with the parallel-arm resonator 107, and is connected in series with the variable capacitor 115.

In the tunable filter 101, a resonant frequency FrS of a circuit portion of the series arm is increased as the capacities of the variable capacitors 110 and 111, i.e., the series capacity, is decreased. In addition, an anti-resonant frequency FaS of the series arm is decreased as the parallel capacity, i.e., the electrostatic capacities of the variable capacitors 108 and 109, is increased.

Similarly, a resonant frequency FrP and an anti-resonant frequency FaP of a circuit portion of the parallel arm can be changed by changing the capacities of the variable capacitors 112 and 113 that are connected in parallel and the capacities of the variable capacitors 114 and 115 that are connected in series. Accordingly, the center frequency of the entire tunable filter 101 can be changed by changing the capacities of the variable capacitors 108 to 115.

However, the tunable filter 101 described in Japanese Unexamined Patent Application Publication No. 2005-217852 has a problem in which the surface acoustic wave resonators used for the series-arm resonators 104 and 105 and the parallel-arm resonators 106 and 107 have small electromechanical coupling coefficients. In addition, there has been a problem in which an absolute value of a temperature coefficient of frequency TCF is large. Further, a large number of components, such as the surface acoustic wave resonators and the variable capacitors, in the series arm and the parallel arm has been required.

SUMMARY OF THE INVENTION

To overcome the problems described above, preferred embodiments of the present invention provide a tunable filter having an increased electromechanical coupling coefficient of a surface acoustic wave resonator, an increased band width ratio of the surface acoustic wave resonator, an increased variable frequency range of the tunable filter, and a decreased change in characteristics as a result of a change in temperature by decreasing an absolute value of a temperature coefficient of frequency TCF.

According to a preferred embodiment of the present invention, a tunable filter preferably includes a surface acoustic wave resonator including a piezoelectric substrate made of $LiNbO_3$ or $LiTaO_3$ and including a recess provided in an upper surface thereof, and an IDT electrode defined by an electrode material filled in the recess, and a variable capacitor connected to the surface acoustic wave resonator.

Hereinafter, $LiNbO_3$ is occasionally abbreviated as LN. Also, $LiTaO_3$ is occasionally abbreviated as LT.

In a tunable filter according to a preferred embodiment of the present invention, the surface acoustic wave resonator preferably further includes a $SiO_2$ film that is arranged to cover the upper surface of the piezoelectric substrate. In this case, an absolute value of a temperature coefficient of frequency TCF is reduced.

In a tunable filter according to another preferred embodiment of the present invention, the piezoelectric substrate is preferably made of a $LiTaO_3$ substrate with Euler angles of (0°, 85° to 150°, 0°), for example, and the electrode material used for the IDT electrode is preferably Au, for example. In this case, the electromechanical coupling coefficient of the surface acoustic wave resonator is further increased, and the absolute value of the temperature coefficient of frequency TCF is further reduced.

In a tunable filter according to another preferred embodiment of the present invention, the IDT electrode is preferably primarily made of an electrode layer made of at least a material selected from a group consisting of Au, Pt, Cu, Al, and an alloy primarily made of any of the Au, Pt, Cu, and Al, for example. In this case, the electromechanical coupling coefficient of the surface acoustic wave resonator is further effectively increased.

In a tunable filter according to another preferred embodiment of the present invention, the IDT electrode preferably includes a plurality of electrode fingers, and a protrusion having a height equivalent or substantially equivalent to a thickness of the electrode fingers is provided on a surface of the $SiO_2$ film at least at a portion disposed above the electrode fingers. In this case, the absolute value of the temperature coefficient of frequency TCF of the surface acoustic wave resonator is further reduced.

In a tunable filter according to another preferred embodiment of the present invention, the IDT electrode preferably includes a plurality of electrode fingers, and a surface of the $SiO_2$ film is substantially flat at a portion disposed above the electrode fingers. In this case, the electromechanical coupling coefficient of the surface acoustic wave resonator is further increased.

In a tunable filter according to another preferred embodiment of the present invention, the electrode that is embedded in the piezoelectric substrate preferably has a duty of about 0.5 or greater, for example.

In a tunable filter according to another preferred embodiment of the present invention, the piezoelectric substrate is preferably made of a $LiNbO_3$ substrate with Euler angles of (0°, 80° to 130°, 0°), for example. When the $LiNbO_3$ substrate with Euler angles within this range is used, the electromechanical coupling coefficient of the surface acoustic wave resonator is sufficiently large.

In a tunable filter according to another preferred embodiment of the present invention, the IDT electrode is preferably primarily made of an electrode layer made of at least a material selected from a group consisting of Au, Pt, Cu, W, Ta, Ag, Mo, Ni, Al, and an alloy primarily made of any of the Au, Pt, Cu, W, Ta, Ag, Mo, Ni, and Al, for example. In this case, the electromechanical coupling coefficient of the surface acoustic wave resonator is further increased.

In a tunable filter according to another preferred embodiment of the present invention, the IDT electrode preferably includes a plurality of electrode fingers, and a surface of the $SiO_2$ film is substantially flat. In this case, the electromechanical coupling coefficient of the surface acoustic wave resonator is further increased.

In a tunable filter according to another preferred embodiment of the present invention, when the $LiNbO_3$ substrate preferably has the Euler angles of (0°, 80° to 130°, 0°), and when the IDT electrode is preferably primarily made of the electrode layer made of at least a material selected from the group consisting of Au, Pt, Cu, W, Ta, Ag, Mo, Ni, Al, and an alloy primarily made of any of the Au, Pt, Cu, W, Ta, Ag, Mo, Ni, and Al, for example, the IDT electrode preferably includes the plurality of electrode fingers, and a protrusion having a height equivalent to a thickness of the electrode fingers is preferably provided on the surface of the $SiO_2$ film at least at a portion disposed above the electrode fingers. In this case, a reflection coefficient of the IDT electrode is increased by the protrusion.

According to another preferred embodiment of the present invention, a tunable filter preferably includes a surface acoustic wave resonator including a piezoelectric substrate made of $LiNbO_3$ with Euler angles of (0°, 80° to 130°, 0°), for example, and including a recess provided in an upper surface thereof, and an IDT electrode in which a metal material that is primarily made of at least a material selected from a group consisting of Au, Pt, W, Ta, Ag, Cu, Mo, and Ni, for example, is embedded in the recess, in which, when $\lambda$ is a wavelength of a surface acoustic wave, a relationship among the metal that primarily defines the IDT electrode, a lower limit of a film thickness of the electrode, and a duty is a relationship shown in Table 1, an upper limit of the film thickness of the electrode is one of the values shown in Table 1, and the duty is in a range from about 0.15 to about 0.85, for example, and a variable capacitor connected with the surface acoustic wave resonator.

TABLE 1

| | (X: Duty) | |
|---|---|---|
| Electrode | Lower limit of film thickness ($\lambda$) | Upper limit of film thickness ($\lambda$) |
| Au | $0.0381 - 0.0211X - 0.0222X^2$ | 0.25 |
| Pt | $0.0501 - 0.0445X - 0.0031X^2$ | 0.25 |
| W | $0.0748 - 0.0978X + 0.0444X^2$ | 0.25 |
| Ta | $0.0739 - 0.0789X + 0.0222X^2$ | 0.25 |
| Ag | $0.1287 - 0.1767X + 0.0667X^2$ | 0.25 |
| Cu | $0.1883 - 0.23X + 0.0667X^2$ | 0.25 |
| Mo | $0.1497 - 0.0990X$ | 0.25 |
| Ni | $0.22112 - 0.13613X + 0.0439X^2$ | 0.25 |

When P is a pitch of electrode fingers and M is a width of the electrode fingers, the duty is a magnitude M/P of the width M of the electrode fingers with respect to the pitch P of the electrode fingers.

According to another preferred embodiment of the present invention, a tunable filter preferably includes a surface acoustic wave resonator including a piezoelectric substrate made of $LiNbO_3$ with Euler angles of (0°, 80° to 130°, 0°), for example, and including a recess provided in an upper surface thereof, and an IDT electrode in which a metal material that is primarily made of at least a material selected from a group consisting of Au, Pt, W, Ta, Ag, Cu, Mo, and Ni, for example, is embedded in the recess, in which, when $\lambda$ is a wavelength of a surface acoustic wave, a relationship among the metal that primarily defines the IDT electrode, a lower limit of a film thickness of the electrode, and a duty is a relationship shown in Table 2, an upper limit of the film thickness of the electrode is one of the values shown in Table 2, and the duty is greater than about 0.5, for example, and a variable capacitor connected with the surface acoustic wave resonator.

TABLE 2

| | (X: Duty) | |
|---|---|---|
| Electrode | Lower limit of film thickness ($\lambda$) | Upper limit of film thickness ($\lambda$) |
| Au | $0.0381 - 0.0211X - 0.0222X^2$ | 0.25 |
| Pt | $0.0501 - 0.0445X - 0.0031X^2$ | 0.25 |
| W | $0.0748 - 0.0978X + 0.0444X^2$ | 0.25 |
| Ta | $0.0739 - 0.0789X + 0.0222X^2$ | 0.25 |
| Ag | $0.1287 - 0.1767X + 0.0667X^2$ | 0.25 |
| Cu | $0.1883 - 0.23X + 0.0667X^2$ | 0.25 |
| Mo | $0.1497 - 0.0990X$ | 0.25 |
| Ni | $0.22112 - 0.13613X + 0.0439X^2$ | 0.25 |

In a tunable filter according to another preferred embodiment of the present invention, the relationship among the metal that primarily defines the IDT electrode, the film thickness of the electrode, and the duty is preferably a relationship shown in Table 3, and the upper limit of the film thickness of the electrode is one of the values shown in Table 3.

TABLE 3

| | (X: Duty) | |
|---|---|---|
| Electrode | Lower limit of film thickness ($\lambda$) | Upper limit of film thickness ($\lambda$) |
| Au | $0.0343 - 0.0190X - 0.0200X^2$ | 0.25 |
| Pt | $0.0451 - 0.0401X - 0.0028X^2$ | 0.25 |
| W | $0.0673 - 0.0880X + 0.040X^2$ | 0.25 |
| Ta | $0.0665 - 0.0710X + 0.020X^2$ | 0.25 |
| Ag | $0.1158 - 0.1590X + 0.060X^2$ | 0.25 |
| Cu | $0.1695 - 0.207X + 0.060X^2$ | 0.25 |
| Mo | $0.1347 - 0.0891X$ | 0.25 |
| Ni | $0.1997 - 0.1259X + 0.0358X^2$ | 0.25 |

The upper limit of the film thickness is preferably determined based on the occurrence of a phenomenon in which a spurious response is generated because the reflection coefficient is excessively large.

According to another preferred embodiment of the present invention, a tunable filter preferably includes a surface acoustic wave resonator having a piezoelectric substrate made of LiNbO$_3$ with Euler angles of (0°, 80° to 130°, 0°), for example, and including a recess provided in an upper surface thereof, and an IDT electrode in which Al or an alloy primarily made of Al is embedded in the recess, in which, when λ is a wavelength of a surface acoustic wave, a normalized film thickness H/λ of the IDT electrode is in a range from about 0.036 to about 0.4, a relationship between an upper limit of a normalized film thickness of Al and a duty is preferably a relationship shown in Table 4, a lower limit of the normalized film thickness of Al is a value shown in Table 4, and a duty is less than about 0.5 or greater than about 0.5, and a variable capacitor connected with the surface acoustic wave resonator.

TABLE 4

(Y: Al film thickness, X: Duty)

| Electrode | Lower limit | Upper limit |
|---|---|---|
| Al | 0.036 λ | Y = −0.9X + 0.766 |

In a tunable filter according to another preferred embodiment of the present invention, a relationship among the metal that primarily defines the IDT electrode, the upper limit of the film thickness of the electrode, and the duty is preferably a relationship shown in Table 5, and the lower limit of the film thickness of the electrode is a value shown in Table 5.

TABLE 5

(Y: Al film thickness, X: Duty)

| Electrode | Lower limit | Upper limit |
|---|---|---|
| Al | 0.036 λ | Y = −0.81X + 0.689 |

According to another preferred embodiment of the present invention, a tunable filter preferably includes a surface acoustic wave resonator including a piezoelectric substrate made of LiNbO$_3$ with Euler angles of (0°, 80° to 130°, 0°), for example, and including a recess provided in an upper surface thereof, and an IDT electrode in which a metal material that is primarily made of at least a material selected from a group consisting of Au, Pt, W, Ta, Ag, Cu, Mo, and Ni, for example, is embedded in the recess, in which, when λ is a wavelength of a surface acoustic wave, a thickness H/λ of the electrode that is primarily made of Au, Pt, W, or Ta is about 0.006 or less, a thickness H/λ of the electrode that is primarily made of Ag is about 0.01 or less, or a thickness H/λ of the electrode that is primarily made of Cu, Mo, or Ni is about 0.013 or less, for example, and a variable capacitor connected with the surface acoustic wave resonator.

In a tunable filter according to another preferred embodiment of the present invention, the surface acoustic wave resonator preferably includes a plurality of surface acoustic wave resonators, and the plurality of surface acoustic wave resonators are preferably connected in series between an input terminal and an output terminal. The variable capacitor preferably includes first and second variable capacitors, the first variable capacitor being connected in series with at least one of the plurality of surface acoustic wave resonators, the second variable capacitor being connected in parallel with at least one of the plurality of surface acoustic wave resonators. Also, the tunable filter preferably further includes an inductance connected between a node of the plurality of surface acoustic wave resonators and a ground, and matching capacitors respectively connected between the input terminal and the ground and between the output terminal and the ground.

In a tunable filter according to another preferred embodiment of the present invention, the matching capacitors and the inductance preferably have impedances in a range from about 20Ω to about 100Ω, for example.

With the tunable filter according to preferred embodiments of the present invention, in a configuration in which the surface acoustic wave resonator is connected with the variable capacitor, since the surface acoustic wave resonator includes the IDT electrode embedded in the electrode material in the groove in the upper surface of the piezoelectric substrate made of LiNbO$_3$ or LiTaO$_3$, the electromechanical coupling coefficient of the surface acoustic wave resonator is increased. Accordingly, the surface acoustic wave resonator having the large band width ratio can be obtained, and thus, a tunable filter having the wide variable frequency range is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is an illustration showing the relationship between the normalized film thickness H/λ of an IDT electrode and the reflection coefficient when the normalized film thickness h/λ of a SiO$_2$ film formed in a surface acoustic wave resonator of 13° YX—LiTaO$_3$ is about 0.2, about 0.3, or about 0.4 in Example 4.

FIG. 8 is an illustration showing the relationship between the normalized film thickness H/λ of the IDT electrode and the electromechanical coupling coefficient k$^2$ when the normalized film thickness h/λ of the SiO$_2$ film formed in the surface acoustic wave resonator is about 0.2, about 0.3, and about 0.4 in Example 4.

DETAILED DESCRIPTION OF THE PREFERRED EMBODIMENTS

Preferred embodiments of the present invention will be described below with reference to the figures.

Figure 1A:
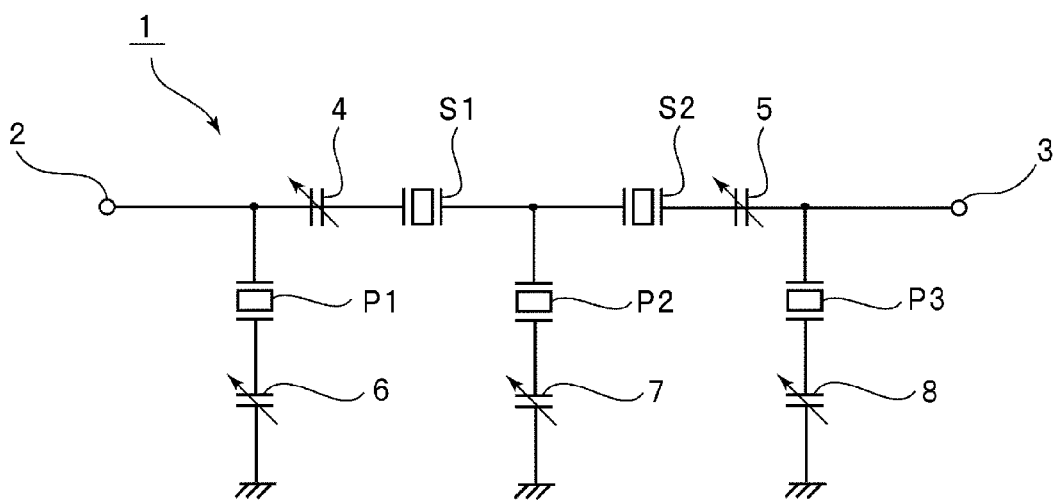
FIG. 1A is an illustration showing a circuit configuration of a tunable filter according to a preferred embodiment of the present invention.
Figure 1B:
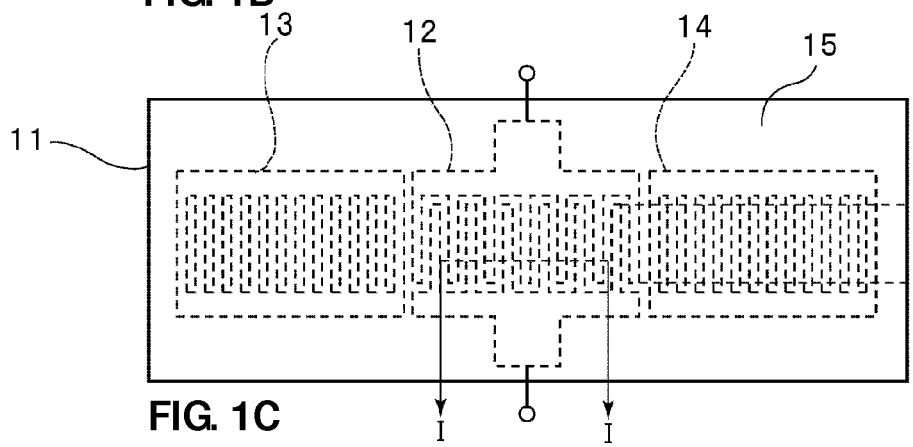
FIG. 1B is a schematic plan view showing a surface acoustic wave resonator included in this preferred embodiment of the present invention.
Figure 1C:
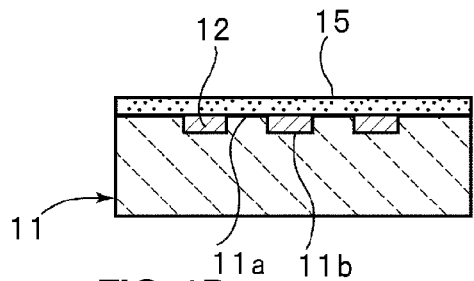
FIG. 1C is a front cross-sectional view of a portion taken along line I-I in FIG. 1B.
Figure 1D:
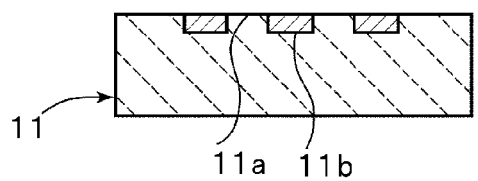
FIG. 1D is a front cross-sectional view of a structure without a SiO$_2$ film shown in FIG. 1C.

FIG. 1A is a circuit diagram of a tunable filter according to a preferred embodiment of the present invention, FIG. 1B is a schematic plan view of a surface acoustic wave resonator used for the tunable filter, FIG. 1C is a front cross-sectional view of a portion taken along line I-I in FIG. 1B, and FIG. 1D is a front cross-sectional view of a structure not including a SiO₂ film shown in FIG. 1C.

As shown in FIG. 1A, a tunable filter 1 preferably includes an input terminal 2 and an output terminal 3. A plurality of series-arm resonators S1 and S2 are preferably connected in series with a series arm that couples the input terminal 2 and the output terminal 3 to each other. A variable capacitor 4 is preferably connected in series with the series-arm resonator S1 at the input side of the series-arm resonator S1. Also, a variable capacitor 5 is preferably connected in series with the series-arm resonator S2 at the output side of the series-arm resonator S2.

A first parallel arm that couples the series arm and a ground potential to each other is preferably provided at the input side of the series-arm resonator S1. A parallel-arm resonator P1 is preferably connected with the first parallel arm. In the first parallel arm, a variable capacitor 6 is preferably connected in series with the parallel-arm resonator P1. Also, a second parallel arm is preferably provided between a node of the series-arm resonators S1 and S2 and the ground potential. A second parallel-arm resonator P2 is preferably connected to the second parallel arm. A variable capacitor 7 is preferably connected in series with the parallel arm resonator P2. Further, a third parallel arm is preferably provided at the output side of the series-arm resonator S2 so as to couple the series arm and the ground potential to each other. A parallel-arm resonator P3 and a variable capacitor 8 are preferably connected with the third parallel arm. The variable capacitor 8 is preferably connected in series with the parallel-arm resonator P3.

The series-arm resonators S1 and S2, and the parallel-arm resonators P1 to P3 are preferably defined by surface acoustic wave resonators. With a ladder filter, a pass band is defined by a resonant frequency of a series-arm resonator and an anti-resonant frequency of a parallel-arm resonator as is known in the art. When the variable capacitors 4 to 8 are connected in series with the series-arm resonators or the parallel-arm resonators, and when the electrostatic capacities of the variable capacitors 4 to 8 are changed, resonant characteristics in the series arm and the parallel arms are changed. Thus, similar to the tunable filter described in Japanese Unexamined Patent Application Publication No. 2005-217852, the center frequency of the tunable filter 1 can be changed.

The series-arm resonators S1 and S2, and the parallel-arm resonators P1 to P3 are preferably defined by surface acoustic wave resonators. The structure of the series-arm resonator S1 will be described as a representative example of a surface acoustic wave resonator. As shown in FIG. 1B to FIG. 1D, the surface acoustic wave resonator that defines the series-arm resonator S1 preferably includes a piezoelectric substrate 11. In this preferred embodiment, the piezoelectric substrate 11 is preferably made of 15° Y cut X propagation LiNbO₃, for example. That is, a LiNbO₃ substrate with Euler angles of (0°, 105°, 0°) is preferably used as the piezoelectric substrate 11.

A plurality of grooves 11b are preferably provided in an upper surface 11a of the piezoelectric substrate 11. By filling the grooves 11b with an electrode material, an IDT electrode 12 is provided. As shown in FIG. 1B, in this preferred embodiment, reflectors 13 and 14 are preferably provided on both sides of the IDT electrode 12 in a surface acoustic wave propagation direction. Thus, a single-port-type surface acoustic wave resonator is provided.

The reflectors 13 and 14 are also preferably provided by filling a plurality of grooves provided in the upper surface 11a of the piezoelectric substrate 11, with an electrode material.

As shown in FIG. 1C and FIG. 1D, an upper surface of the IDT electrode 12, i.e., an upper surface of electrode fingers is preferably flush or substantially flush with the upper surface 11a of the piezoelectric substrate 11.

Thus, after the IDT electrode 12 and the reflectors 13 and 14 are provided in the piezoelectric substrate 11, the upper surface 11a of the piezoelectric substrate 11 is flat. In the structure in FIG. 1C, a SiO₂ film 15 is arranged to cover the upper surface 11a of the piezoelectric substrate 11. In the structure in FIG. 1D, a SiO₂ film is not provided.

Although the series-arm resonator S1 has been described as an example, the series-arm resonator S2 has a similar configuration. Also, the series-arm resonators S1 and S2 are preferably set such that the resonant frequencies are arranged within the pass band of the tunable filter 1 and the anti-resonant frequencies are arranged in a stop band at the higher side of the pass band. In contrast, the parallel-arm resonators P1 to P3 are preferably set such that the resonant frequencies are arranged in a stop band at the lower side of the pass band and the anti-resonant frequencies are arranged within the pass band.

In the tunable filter 1 of this preferred embodiment, since the series-arm resonators S1 and S2, and the parallel-arm resonators P1 to P3 have the above-described structures, electromechanical coupling coefficients $k^2$ of the surface acoustic wave resonators are increased, and the band width ratio is increased. In addition, since the SiO₂ film is provided, the absolute value of a temperature coefficient of frequency TCF is decreased, and a change in characteristic resulting from a change in temperature is decreased. This will be described with reference to FIGS. 2 to 8. Examples of preferred embodiments of the present invention are described below.

EXAMPLE 1

Figure 2:
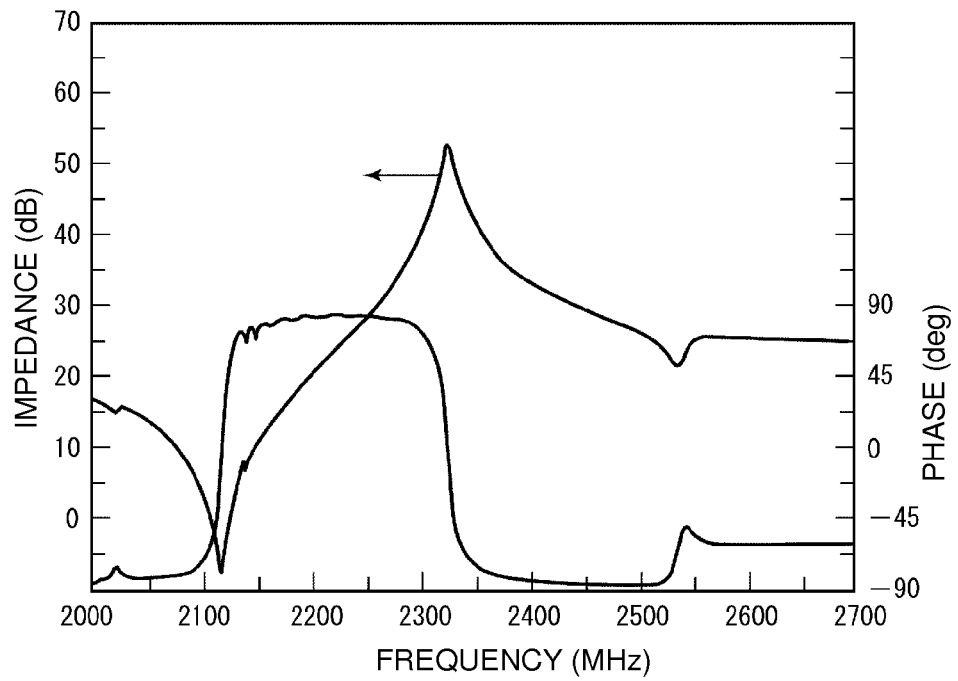
FIG. 2 is an illustration showing frequency characteristics of a surface acoustic wave resonator measured in Example 1, and more particularly, showing an impedance characteristic and a phase characteristic of the surface acoustic wave resonator with a SiO$_2$ film.

FIG. 2 is an illustration showing an impedance characteristic and a phase characteristic of the surface acoustic wave resonator when a LiNbO₃ substrate of 15° Y cut X propagation, i.e., a LiNbO₃ substrate with Euler angles of (0°, 105°, 0°), for example, is used, the electrode material is Al, the film thickness H/λ of the IDT electrode 12 is about 0.17 and the film thickness h/λ of the SiO₂ film is about 0.22, where λ is the wavelength of the surface acoustic wave resonator. For comparison, broken lines in FIG. 33 indicate an impedance-frequency characteristic and a phase characteristic of a surface acoustic wave resonator having a similar configuration except that the SiO₂ film is not provided. Also, solid lines in FIG. 33 indicate the characteristics in FIG. 2 for easier understanding of the comparison.

Figure 33:
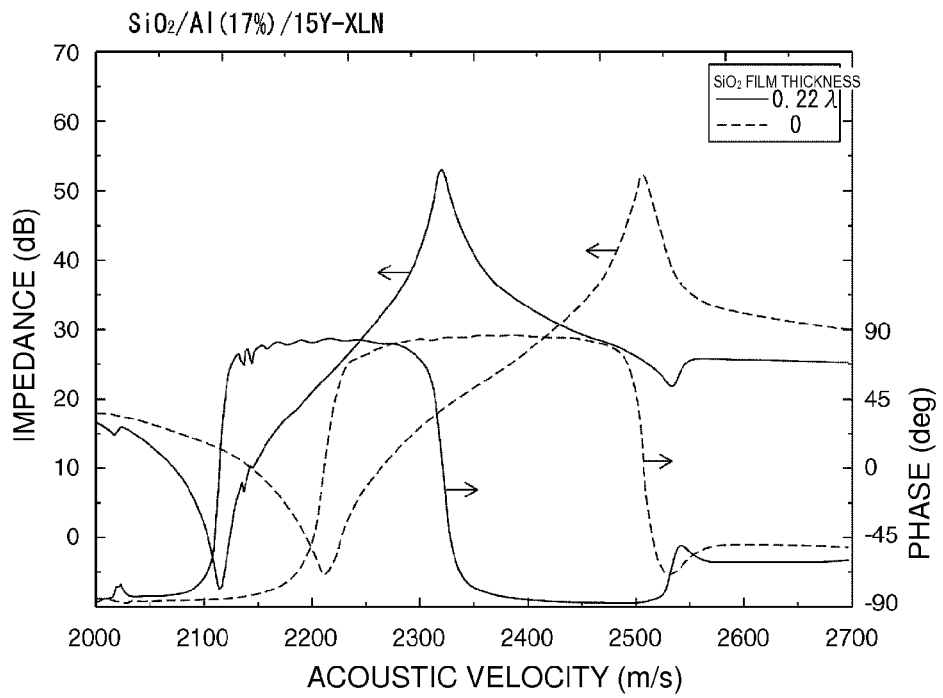
FIG. 33 is an illustration showing frequency characteristics of the surface acoustic wave resonators measured in Example 1, solid lines indicating an impedance characteristic and a phase characteristic of the surface acoustic wave resonator with the SiO$_2$ film, broken lines indicating an impedance characteristic and a phase characteristic of the surface acoustic wave resonator without the SiO$_2$ film.

As shown in FIG. 33, the peak-to-valley ratio, which is the ratio of an impedance at an anti-resonant point to an impedance with a resonant frequency, was about 57.5 dB when the SiO₂ film was not provided. In contrast, the peak-to-valley ratio was about 60.2 dB when the SiO₂ film was provided. Thus, the peak-to-valley ratio could be increased. Further, the temperature coefficient of frequency TCF was about −120 ppm/° C. when the SiO₂ film was not provided. In contrast, the temperature coefficient of frequency TCF was about −10 ppm/° C. to about −30 ppm/° C. when the SiO₂ film was provided. Thus, the absolute value of the temperature coefficient of frequency TCF is decreased.

Accordingly, it was determined that the electromechanical coupling coefficient $k^2$ is slightly decreased due to the SiO₂ film. However, the peak-to-valley ratio can be increased. In addition, it was determined that the temperature characteristic is improved.

EXAMPLE 2

Figure 3:
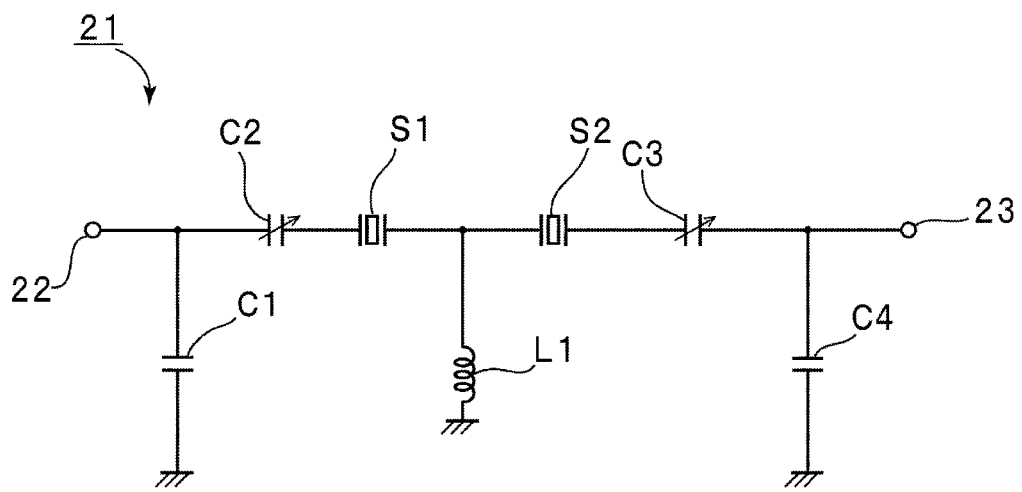
FIG. 3 is a circuit diagram of a tunable filter according to a reference example.

Next, a tunable filter 21 shown in FIG. 3 was provided, and a change in filter characteristic due to a change in electrostatic capacity of a variable capacitor was studied. In the tunable filter 21 shown in FIG. 3, series-arm resonators S1 and S2 are preferably connected in series with each other in a series arm that couples an input terminal 22 and an output terminal 23 to each other. A variable capacitor C2 is preferably connected in series with the series-arm resonator S1 at the input side of the series-arm resonator S1. A parallel arm that couples the series arm and a ground potential with each other is preferably provided at the input side of the series-arm resonator S1. A capacitor C1 is preferably connected with the parallel arm.

A second parallel arm is preferably provided between a node of the series-arm resonators S1 and S2 and the ground potential. An inductance L1 is preferably connected with the second parallel arm. Also, a variable capacitor C3 is preferably connected with the series-arm resonator S2 at the output side of the series-arm resonator S2. Further, a third parallel arm preferably couples the output terminal 23 and the ground potential to each other. A capacitor C4 is connected with the third parallel arm. Even if a capacitor is used instead of the inductor L1, a similar characteristic is obtained.

Similarly to Example 1, the series-arm resonators S1 and S2 each include a $LiNbO_3$ substrate of 15° Y cut X propagation, i.e., with the Euler angles of (0°, 105°, 0°), for example, Al as the electrode material was embedded in grooves in an upper surface of the substrate, and an IDT electrode and reflectors with a normalized film thickness H/λ of about 0.17 were provided, for example. The $SiO_2$ film was not provided. Also, in the structure in which the variable capacitors C2 and C3 have equivalent electrostatic capacities, as shown in FIG. 4, the electrostatic capacities were changed to about 1 pF, about 2 pF, about 5 pF, about 10 pF, about 25 pF, about 50 pF, or about 100 pF, for example, and the filter characteristic was measured.

The electrostatic capacities of the series-arm resonators S1 and S2 were adjusted by changing the number of pairs or the intersecting width of electrode fingers of the IDT electrode. The inductance L1 had a value of about 12 nH, for example.

Figure 4:
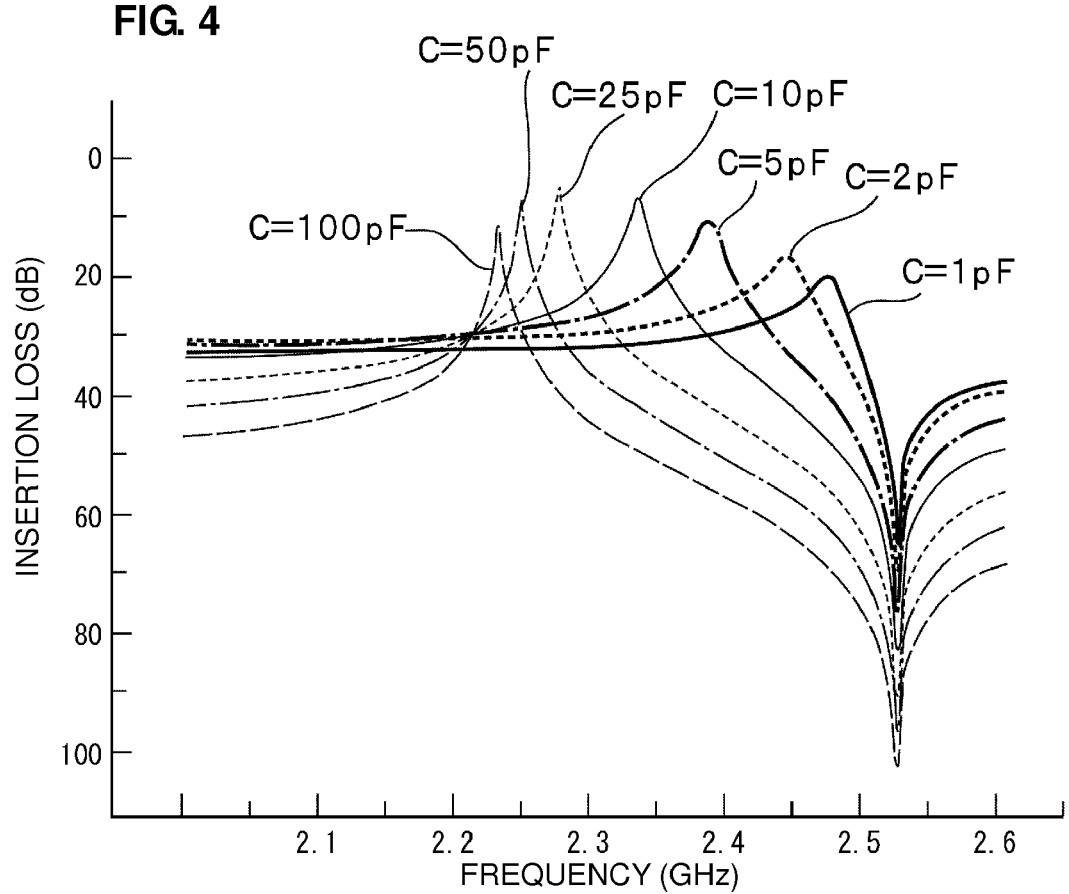
FIG. 4 is an illustration showing a change in filter characteristics when an electrostatic capacity of a variable capacitor in a filter circuit according to the reference example in FIG. 3 is changed in Example 2.

FIG. 4 shows a change in filter characteristic when the electrostatic capacities of the capacitors C1 to C4 and the series-arm resonators S1 and S2 are changed as described above. As shown FIG. 4, it was determined that, as the capacity is changed from about 1 pF to about 100 pF, the center frequency of the filter is changed within an area from approximately 2.21 GHz to approximately 2.48 GHz. Namely, it was determined that the center frequency is changed by about 11%. Thus, it was determined that the pass band of the filter having such a circuit configuration can be adjusted by changing the electrostatic capacities of the capacitors C1 to C4. Although described later, by connecting a capacitor between the input terminal 22 and the output terminal 23 in FIG. 3, the attenuation of high frequencies of about 2.53 GHz or greater is improved.

In this example, $LiNbO_3$ with the Euler angles of (0°, 105°, 0°) was preferably used. However, the inventor of the present invention determined that that a result similar to that of this example could be obtained if a $LiNbO_3$ substrate with Euler angles of (0°, 80° to 130°, 0°), for example, was used.

EXAMPLE 3

Surface acoustic wave resonators with various structures were fabricated using a $LiTaO_3$ substrate with Euler angles of (0°, 126°, 0°) as the piezoelectric substrate, using Au as the electrode material, and arranging the $SiO_2$ film to cover the piezoelectric substrate. When λ was the wavelength determined by the pitch of electrode fingers of the IDT electrode of the surface acoustic wave resonator, the normalized thickness h/λ obtained by normalizing the thickness h of the $SiO_2$ film by the wavelength λ was about 0.3. First to fourth surface acoustic wave resonators A to D were prepared.

A first surface acoustic wave resonator A includes an electrode provided on an upper surface of a piezoelectric substrate and a $SiO_2$ film is provided thereon. A protrusion is provided on an upper surface of the $SiO_2$ film. The protrusion is provided above the electrode and has a height corresponding to a thickness of the electrode.

A second surface acoustic wave resonator B is similar to the first surface acoustic wave resonator A except that a protrusion is not provided on an upper surface of a $SiO_2$ film. The upper surface of the $SiO_2$ film is flat.

A third surface acoustic wave resonator C includes grooves provided in an upper surface of a piezoelectric substrate that are filled with an electrode material to define an IDT electrode and reflectors. An upper surface of the electrode is flush with the upper surface of the piezoelectric substrate. A protrusion is provided on the upper surface of the $SiO_2$ film. The protrusion is provided above the electrode and has a height substantially equivalent to a thickness of the electrode.

A fourth surface acoustic wave resonator D has a structure similar to that of the third surface acoustic wave resonator C except that a protrusion is not provided on an upper surface of a $SiO_2$ film, and the upper surface of the $SiO_2$ film is flat.

Figure 5:
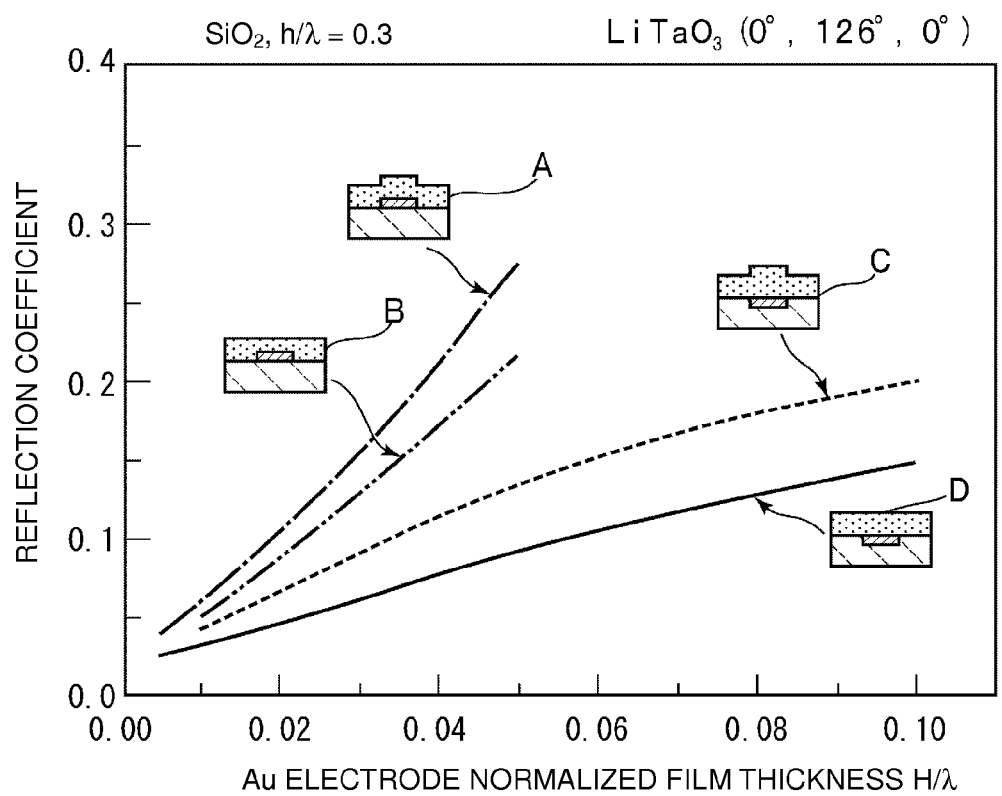
FIG. 5 is an illustration showing a change in reflection coefficient when a normalized film thickness H/λ of an IDT electrode of a surface acoustic resonator of 36° YX—LiTaO$_3$ is changed in Example 3.
Figure 6:
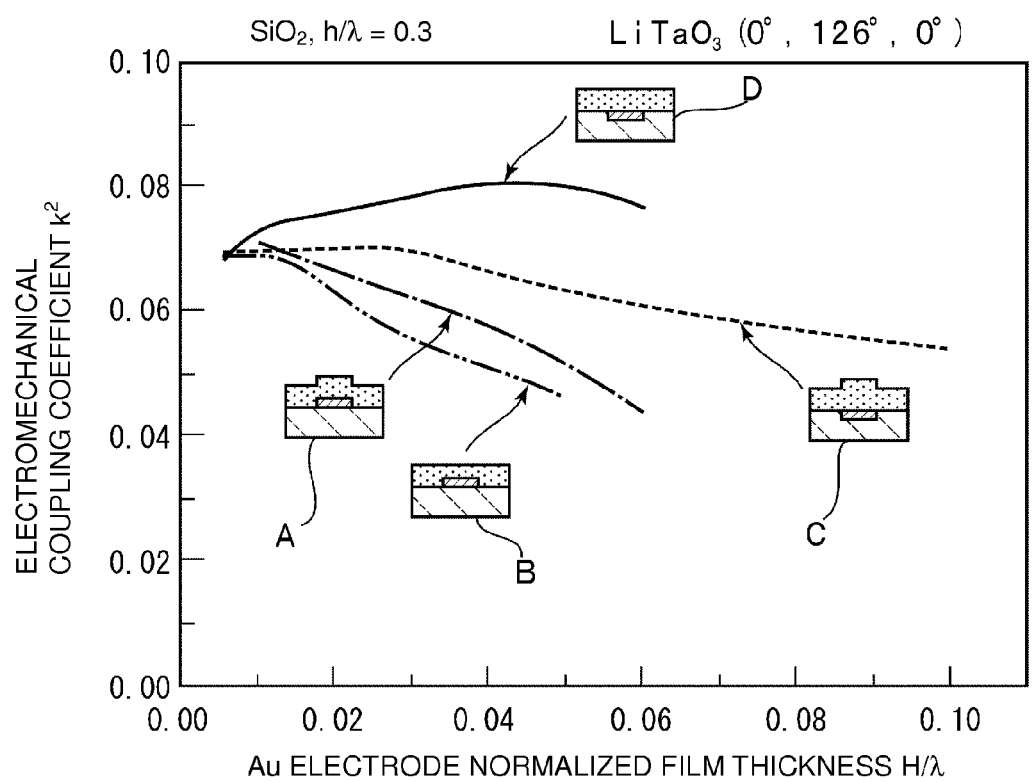
FIG. 6 is an illustration showing a change in electromechanical coupling coefficient k$^2$ when the normalized film thickness H/λ of the IDT electrode of the surface acoustic resonator of 36° YX—LiTaO$_3$ is changed in Example 3.

FIG. 5 shows a change in reflection coefficient of each of the first to fourth surface acoustic wave resonators A to D when the normalized film thickness h/λ of the $SiO_2$ film is about 0.3 and the normalized film thickness H/λ of the electrode is changed. Also, FIG. 6 is an illustration showing a change in electromechanical coupling coefficient $k^2$ of each of the first to fourth surface acoustic wave resonators when the normalized film thickness H/λ of the electrode is changed. The temperature coefficient of frequency TCF of the $SiO_2$ film has a positive value and the temperature coefficient of frequency TCF of the $LiTaO_3$ substrate has a negative value as is known in the art. Thus, in either case, the absolute value of the temperature coefficient of frequency TCF is decreased and the temperature characteristic is improved as the result of the $SiO_2$ film being provided.

As shown in FIGS. 5 and 6, when the $SiO_2$ film is provided, with each of the first surface acoustic wave resonator A, the second surface acoustic wave resonator B, and the third surface acoustic wave resonator C, the electromechanical coupling coefficient $k^2$ is decreased. In particular, the electromechanical coupling coefficient $k^2$ is decreased as the normalized film thickness H/λ of the IDT electrode is increased.

In contrast, with the fourth surface acoustic wave resonator D, the electromechanical coupling coefficient $k^2$ can be large by setting the normalized film thickness of the IDT electrode to be within a specific range. With the fourth surface acoustic wave resonator D with the upper surface of the $SiO_2$ film being flat, by determining the normalized film thickness H/λ of the IDT electrode to be within a range from about 0.01 to about 0.09, for example, the electromechanical coupling coefficient $k^2$ can be effectively large.

Also, as shown in FIG. 5, with any of the first to fourth surface acoustic wave resonators A to D, the reflection coefficient is increased as the film thickness of the IDT electrode is increased.

Comparing the results of the third and fourth surface acoustic wave resonators C and D, if the third and fourth surface acoustic wave resonators C and D have equivalent normalized film thicknesses for the IDT electrodes, the reflection coefficient of the third surface acoustic wave resonator C with the protrusion on the upper surface is greater than that of the fourth surface acoustic wave resonator D. Thus, to obtain a large reflection coefficient, the protrusion is preferably provided on the upper surface of the $SiO_2$ film.

The reflection coefficient is sufficient as long as the reflection coefficient has a certain value, for example about 0.02, or greater depending on the application. Thus, to reduce a variation in reflection coefficient as a result of a variation in film thickness of the IDT electrode and to provide a resonator having a wide band, it was determined that the fourth surface acoustic wave resonator D with the upper surface of the $SiO_2$ film being flat is preferable.

As described above, in this example, with the structure including Au that is embedded in the grooves provided in the upper surface of the $LiTaO_3$ piezoelectric substrate with the Euler angles of (0°, 126°, 0°) to define the IDT electrode and the $SiO_2$ film is provided thereon, the electromechanical coupling coefficient can be effectively large by determining the normalized film thickness H/λ of the IDT electrode to be within the range from about 0.01 to about 0.09, for example, as long as the surface of the $SiO_2$ film is flat. Accordingly, the band width ratio can be increased. If the series-arm resonator and the parallel-arm resonator of the tunable filter are used, the frequency characteristics of the tunable filter can be further effectively adjusted. Similar results are obtained even if an electrode is made of a material other than Au.

EXAMPLE 4

Next, an IDT electrode and reflectors were formed on a $LiNbO_3$ substrate with Euler angles of (0°, 103°, 0°) as the piezoelectric substrate and grooves in an upper surface of the piezoelectric substrate were filled with Au as the electrode material. In addition, a $SiO_2$ film was provided on the upper surface of the piezoelectric substrate. A protrusion was provided on an upper surface of the $SiO_2$ film. The protrusion had a height substantially the same a thickness of the IDT electrode. That is, the third surface acoustic wave resonator C from Example 3 was provided.

A change in reflection coefficient and a change in electromechanical coupling coefficient were obtained by changing the normalized film thickness h/λ of the $SiO_2$ film and the normalized film thickness H/λ of the IDT electrode. FIG. 7 is an illustration showing a change in reflection coefficient due to a change in normalized film thickness H/λ of the IDT electrode when the normalized film thickness of the $SiO_2$ film is about 0.2, about 0.3, or about 0.4. FIG. 8 is an illustration showing a change in electromechanical coupling coefficient $k^2$.

As shown in FIG. 7, it was determined that, when the normalized film thickness h/λ of the $SiO_2$ film is about 0.2, about 0.3, or about 0.4, the reflection coefficient is increased as the normalized film thickness H/λ of the IDT electrode is increased.

As shown in FIG. 8, when the normalized film thickness h/λ of the $SiO_2$ film is about 0.2, the electromechanical coupling coefficient $k^2$ is decreased as the normalized film thickness H/λ of the IDT electrode is increased.

In contrast, when the normalized film thickness h/λ of the $SiO_2$ film is about 0.3 or about 0.4, the electromechanical coupling coefficient $k^2$ is increased as the normalized film thickness H/λ of the IDT electrode is increased, and the electromechanical coupling coefficient $k^2$ is decreased when H/λ is further increased. In other words, as shown in FIG. 8, for the third surface acoustic wave resonator C including the protrusion provided on the upper surface of the $SiO_2$ film, the electromechanical coupling coefficient $k^2$ can be increased by setting the normalized film thickness h/λ of the $SiO_2$ film to be about 0.3 or greater and by selecting the normalized film thickness H/λ of the IDT electrode.

When the normalized film thickness h/λ of the $SiO_2$ film is less than about 0.2, if the normalized film thickness H/λ of the IDT electrode is increased, the reflection coefficient is increased whereas the electromechanical coupling coefficient $k^2$ is decreased. Thus, the reflection coefficient and the electromechanical coupling coefficient $k^2$ have the tradeoff relationship. However, as long as the reflection coefficient is a certain value or greater depending on the application, the reflection coefficient does not need to be very large.

When the normalized film thickness h/λ of the $SiO_2$ film is about 0.3 or greater, by selecting the normalized film thickness H/λ of the IDT electrode, both the reflection coefficient and the electromechanical coupling coefficient $k^2$ can be properly increased. Thus, with the structure in which the grooves were provided in the upper surface of $LiNbO_3$, the electrode was provided in the grooves, and the $SiO_2$ film was provided thereon, if the protrusion is provided on the upper surface of the $SiO_2$ film, the normalized film thickness h/λ of the $SiO_2$ film is preferably about 0.2 or greater, for example.

Since this example includes the structure in which the grooves provided in the upper surface of the piezoelectric substrate of $LiNbO_3$ with the Euler angles of (0°, 103°, 0°) are filled with Au, the $SiO_2$ film is provided, and the protrusion is provided on the upper surface of the $SiO_2$ film, as described above, both the electromechanical coupling coefficient $k^2$ and the reflection coefficient can be increased. When the structure is used as the series-arm resonator or the parallel-arm resonator of the tunable filter, the temperature characteristic of the tunable filter is improved and the electromechanical coupling coefficient is improved. Accordingly, the band width can be further effectively adjusted.

EXAMPLE 5

In Examples 3 and 4, $LiTaO_3$ with the Euler angles of (0°, 126°, 0°) or $LiNbO_3$ with the Euler angles of (0°, 103°, 0°) was used. An experiment by the inventor of the present invention determined that a similar result is obtained even when $LiTaO_3$ with the Euler angles of (0°, 85° to 150°, 0°), for example, was used.

Also, it was determined that a similar result could be obtained even when $LiTaO_3$ with the Euler angles of (0°, 80° to 130°, 0°), for example, was used.

This will be described with reference to FIGS. 9 to 16. A structure similar to that of the fourth surface acoustic wave resonator D in Example 3 was obtained by providing grooves in an upper surface of a $LiNbO_3$ substrate with the Euler angles of (0°, θ, 0°), filling the grooves with metal to define an IDT electrode, and providing a $SiO_2$ film thereon. For comparison, a surface acoustic wave resonator according to a comparative example having the same structure as the surface acoustic wave resonator B was fabricated by providing an electrode on a $LiNbO_3$ substrate with the Euler angles of (0°, θ, 0°) and providing a $SiO_2$ film thereon such that an upper surface of the $SiO_2$ film is flat. The normalized film thickness h/λ of the $SiO_2$ film was about 0.25 in an area not provided with the electrode.

Figure 9:
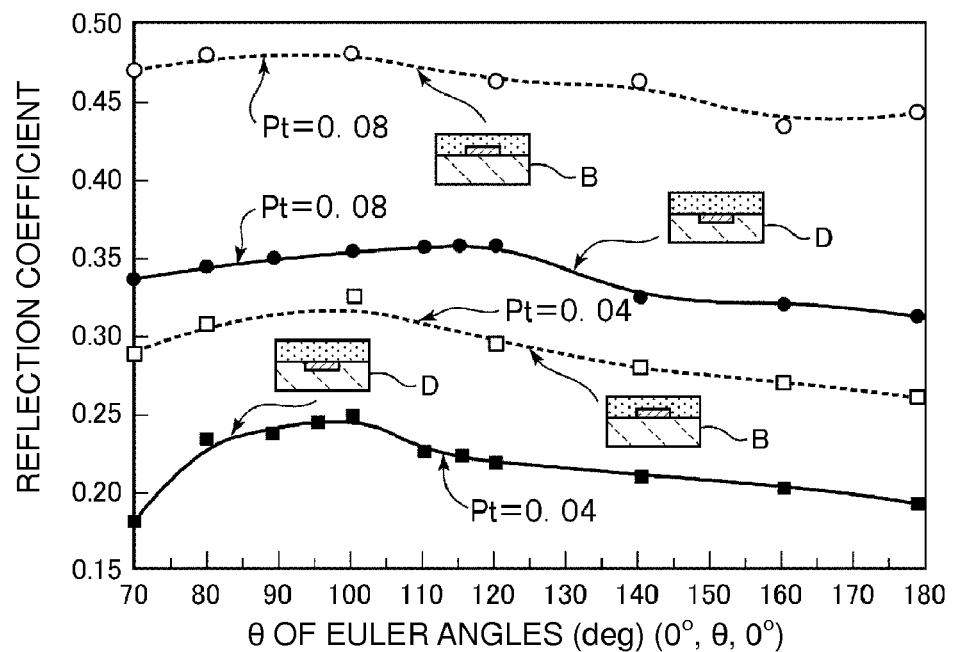
FIG. 9 is an illustration showing the relationship between θ of Euler angles of (0°, θ, 0°) of each of surface acoustic wave resonators with various configurations including LiNbO$_3$ and the reflection coefficient when the normalized film thickness h/λ of a SiO$_2$ film is about 0.25 and the normalized film thickness H/λ of an IDT electrode made of Pt is about 0.04 or about 0.08 in Example 5.
Figure 10:
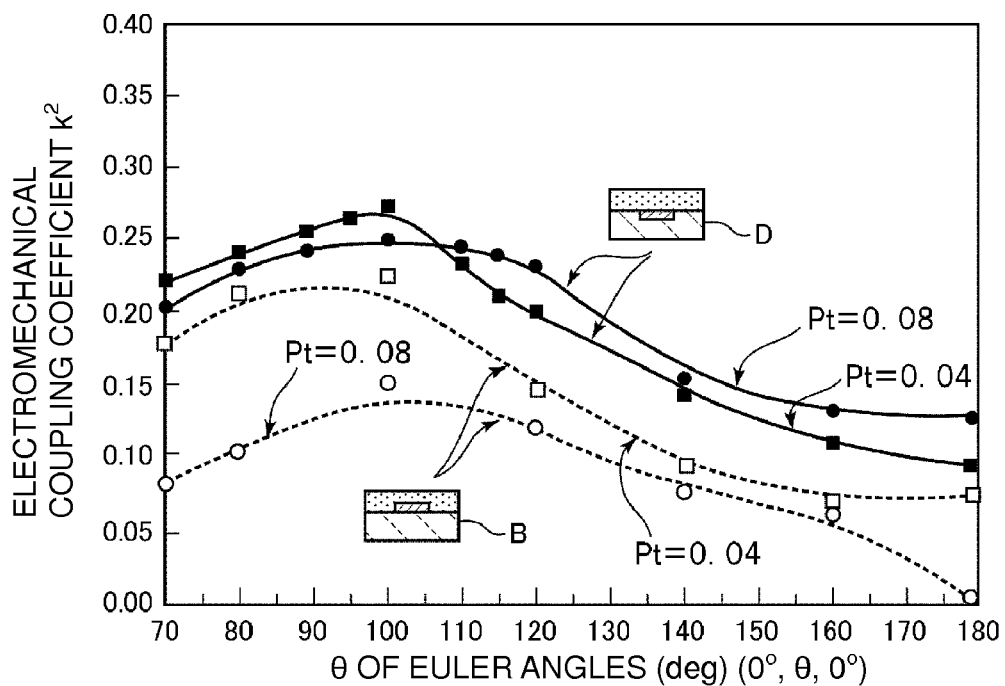
FIG. 10 is an illustration showing the relationship between θ of the Euler angles of (0°, θ, 0°) of each of the surface acoustic wave resonators with the various configurations including LiNbO$_3$ and the electromechanical coupling coefficient when the normalized film thickness h/λ of the SiO$_2$ film is about 0.25 and the normalized film thickness H/λ of the IDT electrode made of Pt is about 0.04 or about 0.08 in Example 5.
Figure 11:
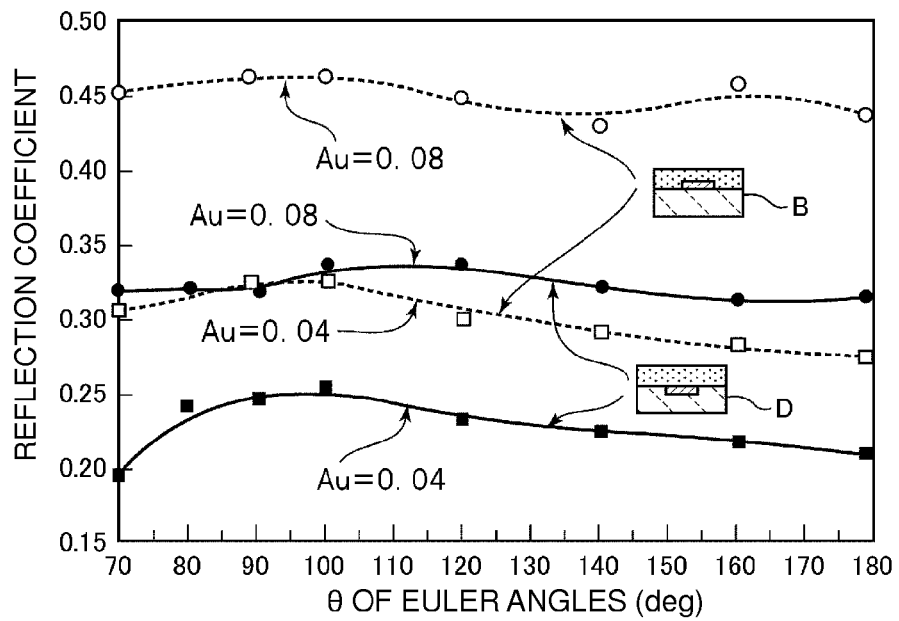
FIG. 11 is an illustration showing the relationship between θ of the Euler angles of (0°, θ, 0°) of each of the surface acoustic wave resonators with the various configurations including LiNbO$_3$ and the reflection coefficient when the normalized film thickness h/λ of the SiO$_2$ film is about 0.25 and the normalized film thickness H/λ of an IDT electrode made of Au is about 0.04 or about 0.08 in Example 5.
Figure 12:
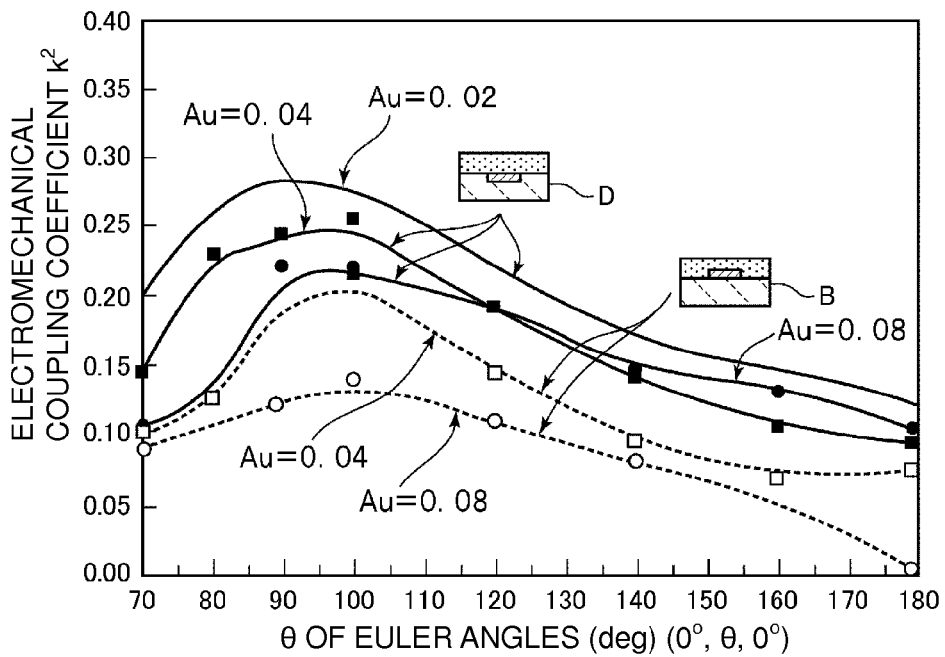
FIG. 12 is an illustration showing the relationship between θ of the Euler angles of (0°, θ, 0°) of each of the surface acoustic wave resonators with the various configurations including LiNbO$_3$ and the electromechanical coupling coefficient when the normalized film thickness h/λ of the SiO$_2$ film is about 0.25 and the normalized film thickness H/λ of the IDT electrode made of Au is about 0.04 or about 0.08 in Example 5.
Figure 13:
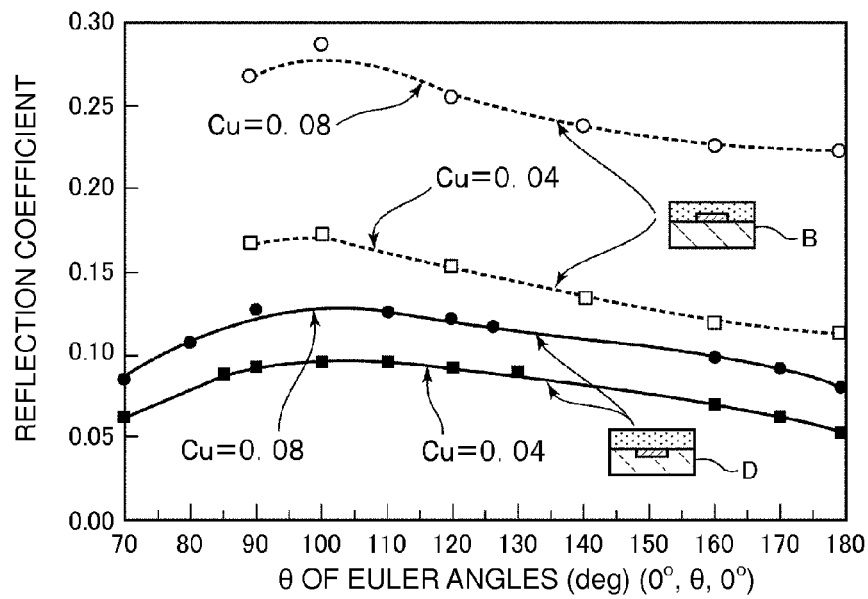
FIG. 13 is an illustration showing the relationship between θ of the Euler angles of (0°, θ, 0°) of each of the surface acoustic wave resonators with the various configurations including LiNbO$_3$ and the reflection coefficient when the normalized film thickness h/λ of the SiO$_2$ film is about 0.25 and the normalized film thickness H/λ of an IDT electrode made of Cu is about 0.04 or about 0.08 in Example 5.
Figure 14:
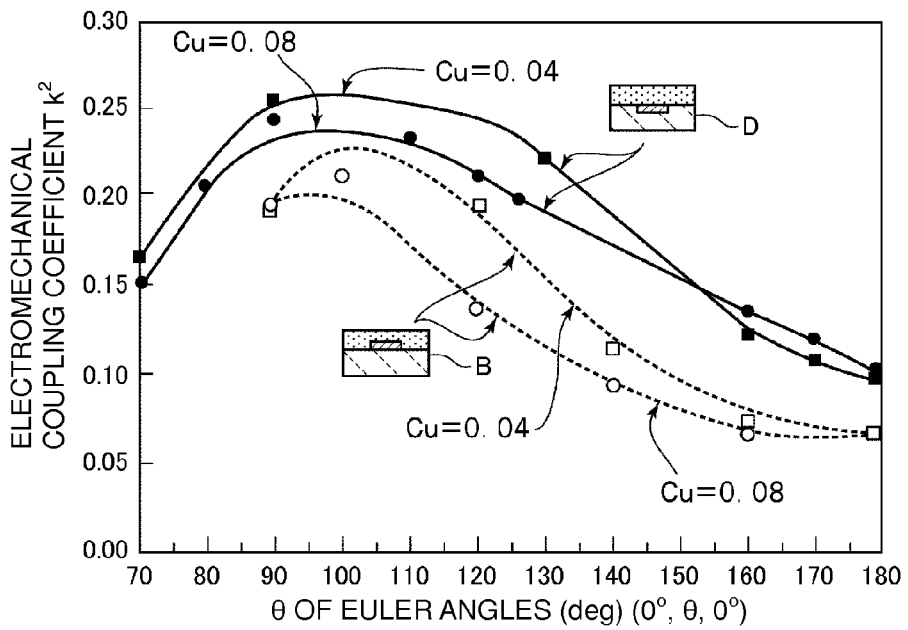
FIG. 14 is an illustration showing the relationship between θ of the Euler angles of (0°, θ, 0°) of each of the surface acoustic wave resonators with the various configurations including LiNbO$_3$ and the electromechanical coupling coefficient when the normalized film thickness h/λ of the SiO$_2$ film is about 0.25 and the normalized film thickness H/λ of the IDT electrode made of Cu is about 0.04 or about 0.08 in Example 5.
Figure 15:
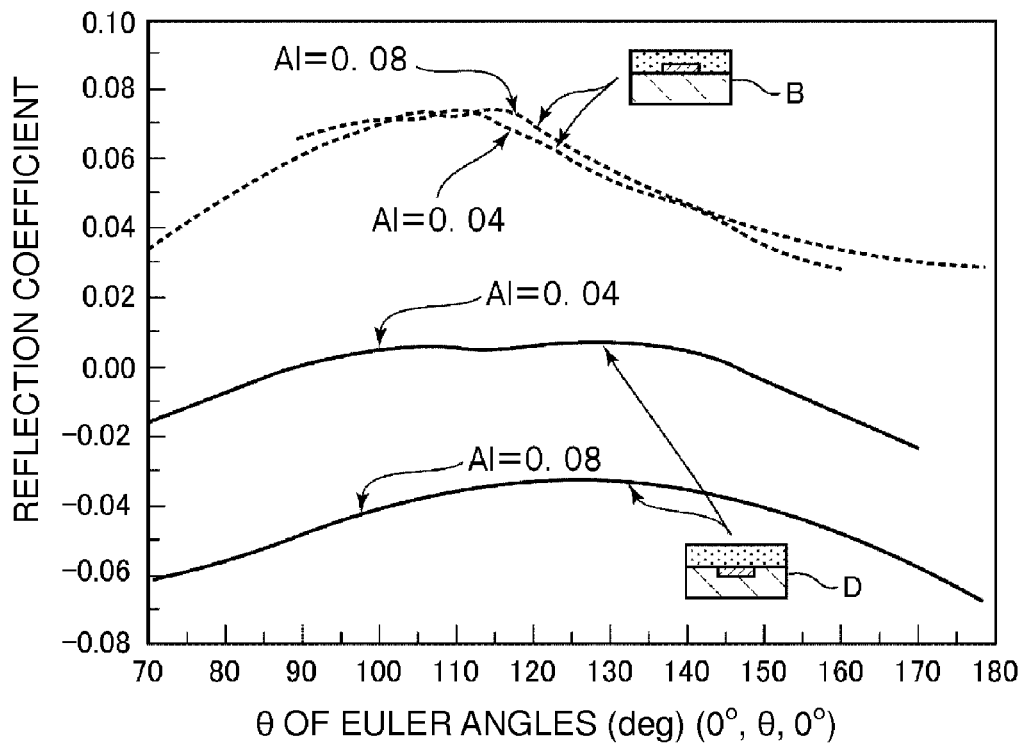
FIG. 15 is an illustration showing the relationship between θ of the Euler angles of (0°, θ, 0°) of each of the surface acoustic wave resonators with the various configurations including LiNbO$_3$ and the reflection coefficient when the normalized film thickness h/λ of the SiO$_2$ film is about 0.25 and the normalized film thickness H/λ of an IDT electrode made of Al is about 0.04 or about 0.08 in Example 5.
Figure 16:
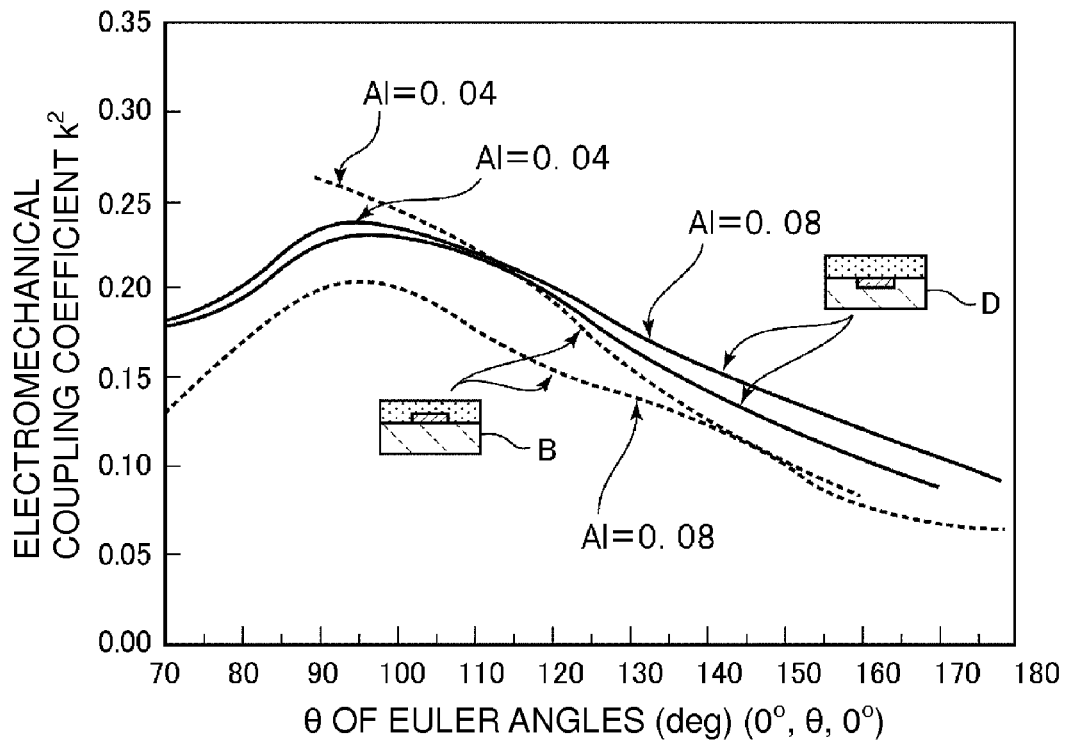
FIG. 16 is an illustration showing the relationship between θ of the Euler angles of (0°, θ, 0°) of each of the surface acoustic wave resonators with the various configurations including LiNbO$_3$ and the electromechanical coupling coefficient when the normalized film thickness h/λ of the SiO$_2$ film is about 0.25 and the normalized film thickness H/λ of the IDT electrode made of Al is about 0.04 or about 0.08 in Example 5.

For each of the two types of the surface acoustic wave resonators, Pt was used as the electrode material, and the normalized film thickness H/λ of the electrode was about 0.04 or about 0.08. A change in reflection coefficient and a change in electromechanical coupling coefficient for θ of the Euler angles were measured. FIGS. 9 and 10 show the results.

As shown in FIGS. 9 and 10, when Pt is used as the electrode material, with the surface acoustic wave resonator corresponding to a preferred embodiment of the present invention, it was determined that a sufficiently large electromechanical coupling coefficient can be obtained as long as the Euler angles of LiNbO₃ is within the range of (0°, 80° to 130°, 0°), for example. Then, the electrode material was changed from Pt to Au, Cu, and Al. Similarly, the relationship between the Euler angles and the reflection coefficient, and the relationship between the Euler angles and the electromechanical coupling coefficient were obtained. FIGS. 11 to 16 show the results. As shown in FIGS. 11 to 16, even when Au, Cu, or Al was used as the electrode material, as long as θ of the Euler angles of LiNbO₃ was within the range from 80° to 130°, a large electromechanical coupling coefficient could be obtained as in Example 4. Also, it was determined that a large electromechanical coupling coefficient could be obtained with any values of Euler angles if the surface acoustic wave resonator had the same structure as the structure of the surface acoustic wave resonator D rather than the structure of the surface acoustic wave resonator B.

Similarly, a structure similar to that of the fourth surface acoustic wave resonator D in Example 3 was obtained by providing grooves in an upper surface of a LiTaO₃ substrate with the Euler angles of (0°, θ, 0°), filling the grooves with metal to form an IDT electrode, and providing a SiO₂ film thereon. Also, for comparison, a surface acoustic wave resonator according to a comparative example having substantially the same structure as the surface acoustic wave resonator B was fabricated by providing an electrode on a LiTaO₃ substrate with the Euler angles of (0°, θ, 0°) and providing a SiO₂ film thereon such that an upper surface of the SiO₂ film becomes flat. The normalized film thickness h/λ of the SiO₂ film was about 0.25 in an area not provided with the electrode.

Figure 17:
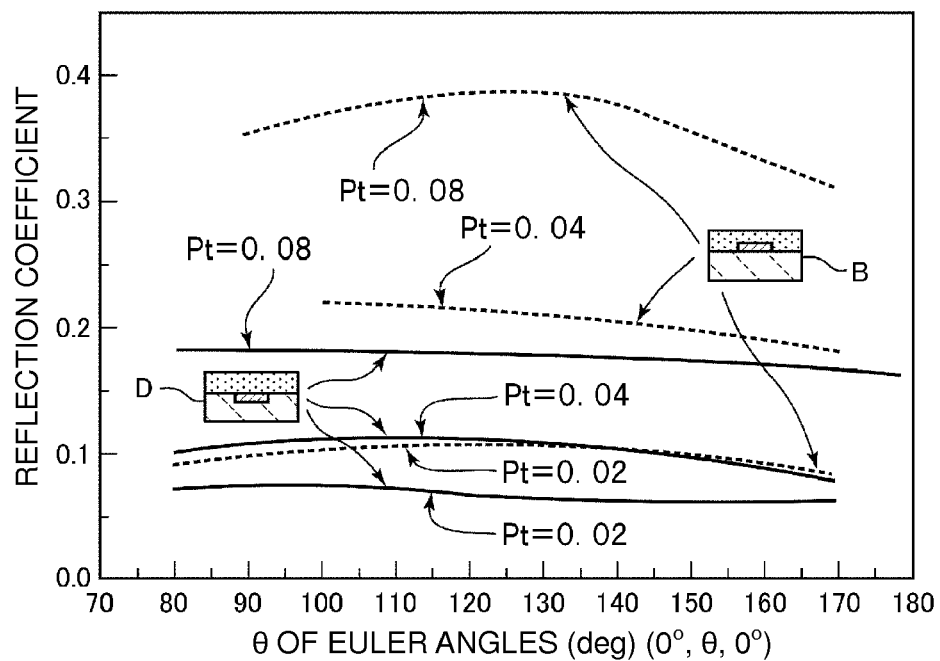
FIG. 17 is an illustration showing the relationship between θ of the Euler angles of (0°, θ, 0°) of each of the surface acoustic wave resonators and the reflection coefficient when LiTaO$_3$ is used, the normalized film thickness h/λ of the SiO$_2$ film is about 0.25, and the normalized film thickness H/λ of the IDT electrode made of Pt is about 0.02, about 0.04 or about 0.08 in Example 5.
Figure 18:
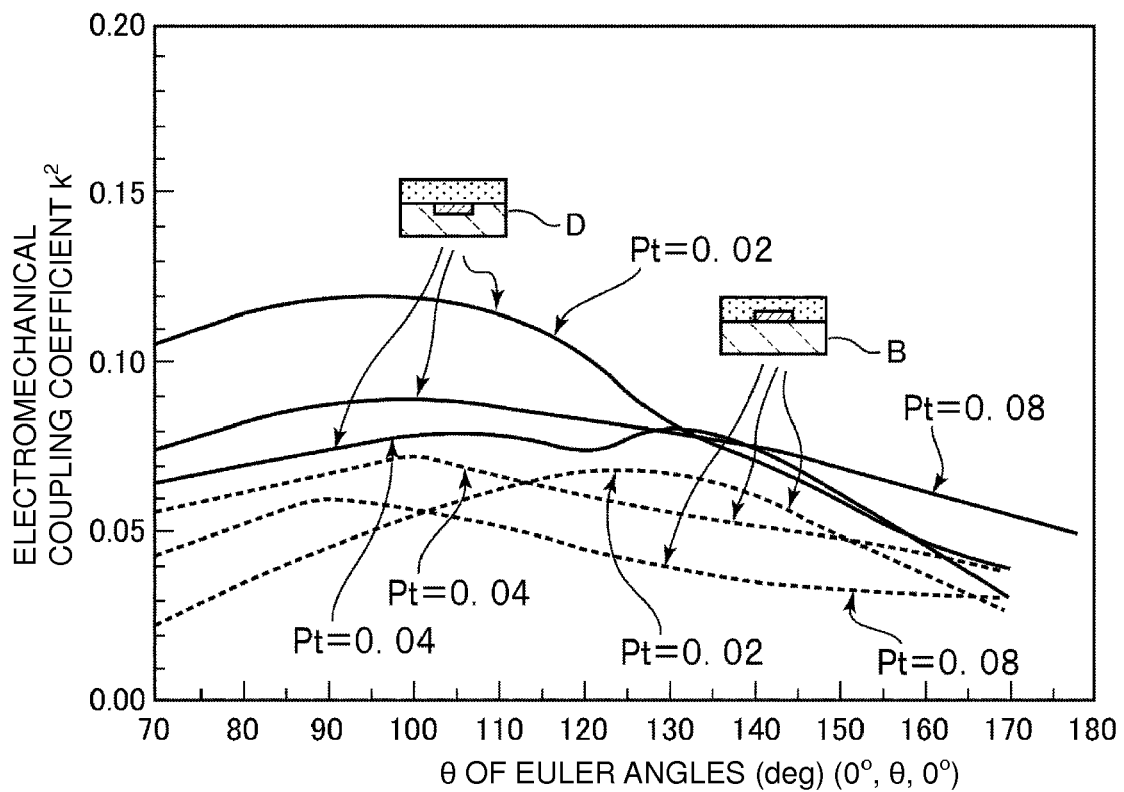
FIG. 18 is an illustration showing the relationship between θ of the Euler angles of (0°, θ, 0°) of each of the surface acoustic wave resonators and the electromechanical coupling coefficient when LiTaO$_3$ is used, the normalized film thickness h/λ of the SiO$_2$ film is about 0.25, and the normalized film thickness H/λ of the IDT electrode made of Pt is about 0.02, about 0.04 or about 0.08 in Example 5.

For each of the two types of the surface acoustic wave resonators, Pt was used as the electrode material, and the normalized film thickness H/λ of the electrode was about 0.02, about 0.04, or about 0.08. A change in reflection coefficient and a change in electromechanical coupling coefficient for θ of the Euler angles were measured. FIGS. 17 and 18 show the results. For LiTaO₃, it was determined that the electromechanical coupling coefficient was large and the band width could be effectively adjusted as long as LiTaO₃ with the Euler angles of (0°, 85° to 150°, 0°), for example, was used. Also, an experiment by the inventor of the present invention determined that the electromechanical coupling coefficient could be large even if the electrode material was changed from Pt to Au, Cu, or Al as long as θ of the Euler angles was in the similar range. Also, the structure in which the electrode is embedded in the grooves provides a larger electromechanical coupling coefficient.

Regarding the Euler angles of LiTaO₃ and LiNbO₃, as long as (0°, θ, 0°) is in a range of (0°±5°, θ, 0°±5°), i.e., if φ and ψ of the Euler angles each are within the range of about 0°±5°, it was discovered that a result similar to a result when φ and ψ of the Euler angles each are 0° is obtained. Thus, it is to be noted that φ and ψ being 0° means that φ and ψ each permit the range of 0°±5°.

EXAMPLE 6

A surface acoustic wave resonator used in a ladder filter or a resonator filter provides a good anti-resonant characteristic if a low transversal wave velocity of a piezoelectric substrate is not present between an acoustic velocity corresponding to a resonant frequency and an acoustic velocity corresponding to an anti-resonant frequency of the surface acoustic wave resonator. If the low transversal wave velocity of the piezoelectric substrate is present between the acoustic velocity corresponding to the resonant frequency and the acoustic velocity corresponding to the anti-resonant frequency of the surface acoustic wave resonator, a spurious response at a frequency corresponding to the low transversal wave is generated between the resonant frequency and the anti-resonant frequency. Thus, a good anti-resonant characteristic cannot be obtained.

Figure 19:
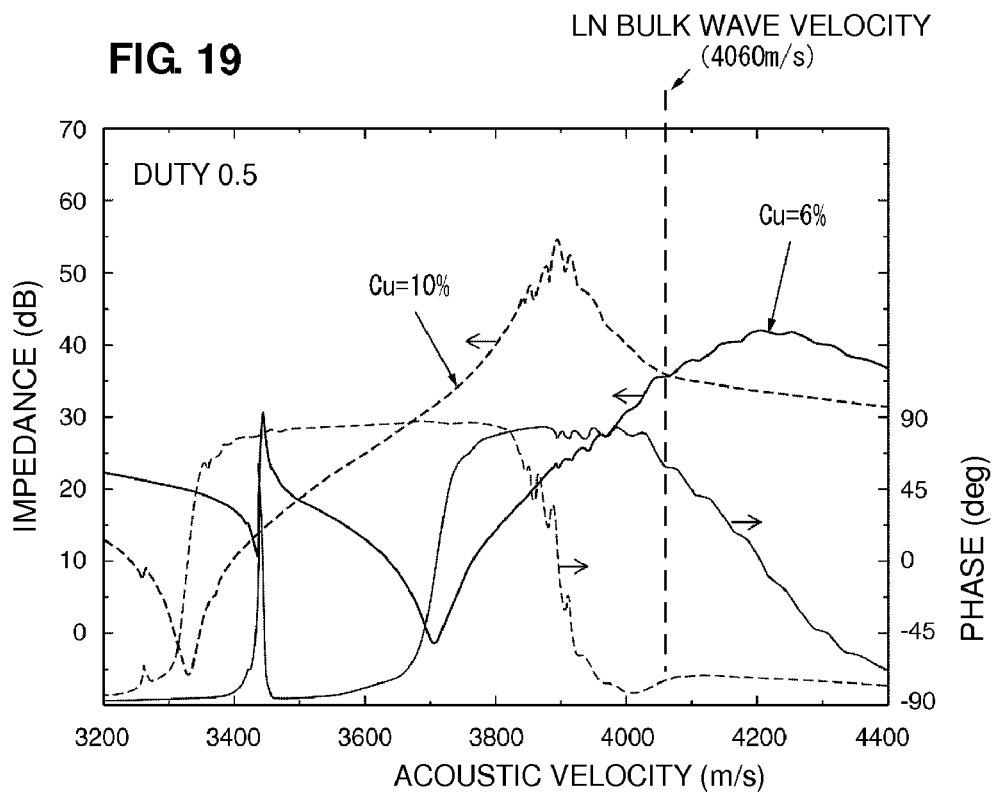
FIG. 19 is an illustration showing an impedance characteristic and a phase characteristic of a surface acoustic wave resonator when a LiNbO$_3$ substrate is used, an IDT electrode includes Cu embedded therein by a thickness of about 6% or about 10% of the wavelength, and the duty is about 0.5 in Example 6.

FIG. 19 is an illustration showing impedance frequency characteristics and phase frequency characteristics of a surface acoustic wave resonator when grooves are provided in an upper surface of a Y cut X propagation LiNbO₃ substrate, and an IDT electrode is defined by filling the grooves with Cu. FIG. 19 shows the results when the depth of the grooves, i.e., the thickness H/λ of the IDT electrode made of Cu is about 6% (0.06) and about 10% (0.1) of the wavelength λ. The horizontal axis of FIG. 19 is represented by the acoustic velocity that is the product of the frequency of the surface acoustic wave and the wavelength λ.

As shown in FIG. 19, when the thickness H/λ of the IDT electrode made of Cu is about 0.06, the acoustic velocity corresponding to the anti-resonant frequency is about 4200 m/s, and thus, the velocity is greater than the acoustic velocity of about 4060 m/s of the low transversal bulk wave of LiNbO₃. A low transversal wave is present between the resonant frequency and the anti-resonant frequency, and a portion of the impedance characteristic curve around the anti-resonant frequency is not sharp but, instead, is round.

In contrast, if the thickness of the IDT electrode made of Cu is about 0.1, the acoustic velocity corresponding to the anti-resonant frequency is about 3900 m/s, and this velocity is less than the acoustic velocity of about 4060 m/s of the low transversal bulk wave of LiNbO₃. Thus, the impedance characteristic around the anti-resonant frequency is sharp and a good characteristic is obtained.

Figure 27:
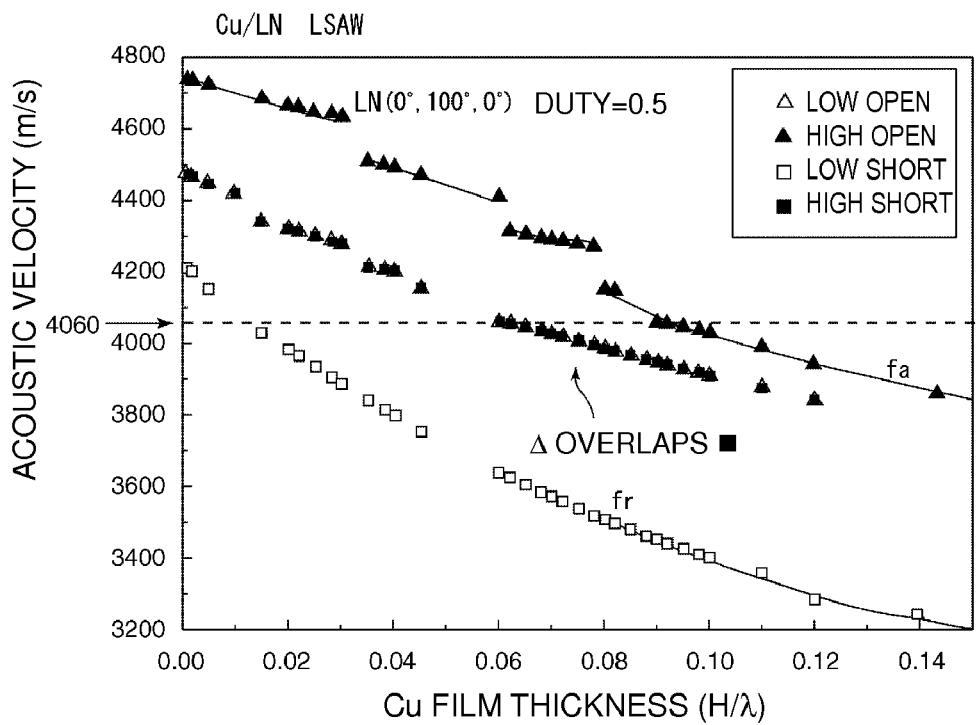
FIG. 27 is an illustration showing the relationship between the normalized film thickness H/λ of an IDT electrode and the surface acoustic wave velocity when the LiNbO$_3$ substrate with the Euler angles of (0°, 100°, 0°), i.e., of about 10° Y cut X propagation is used, the IDT electrode includes Cu embedded therein, and the duty is about 0.5 in Example 6.
Figure 28:
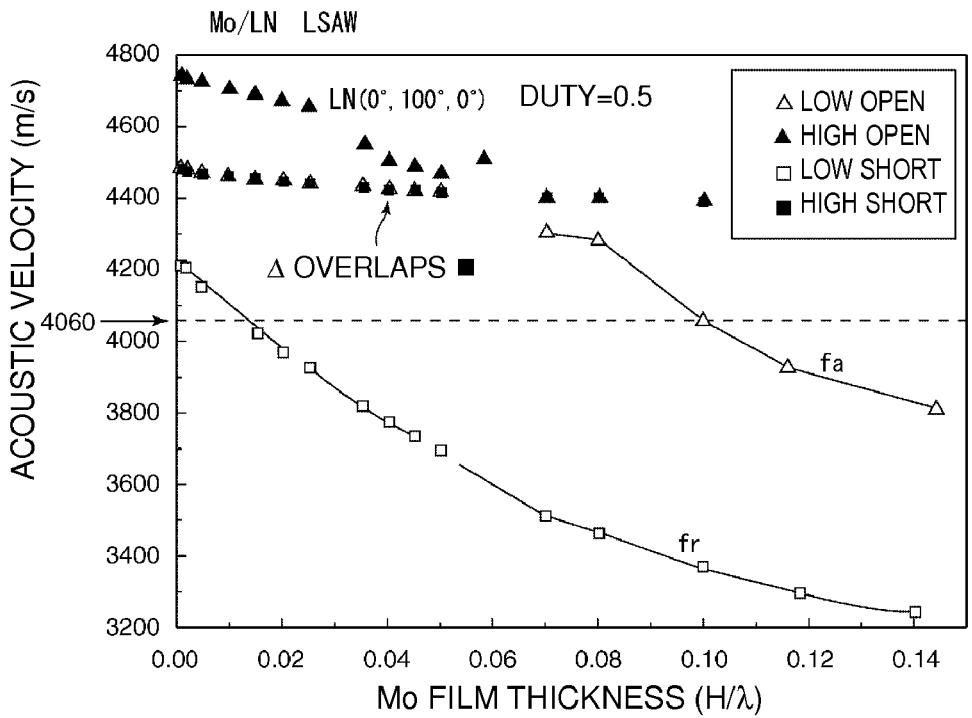
FIG. 28 is an illustration showing the relationship between the normalized film thickness H/λ of an IDT electrode and the surface acoustic wave velocity when the LiNbO$_3$ substrate with the Euler angles of (0°, 100°, 0°), i.e., of about 10° Y cut X propagation is used, the IDT electrode includes Mo embedded therein, and the duty is about 0.5 in Example 6.
Figure 39:
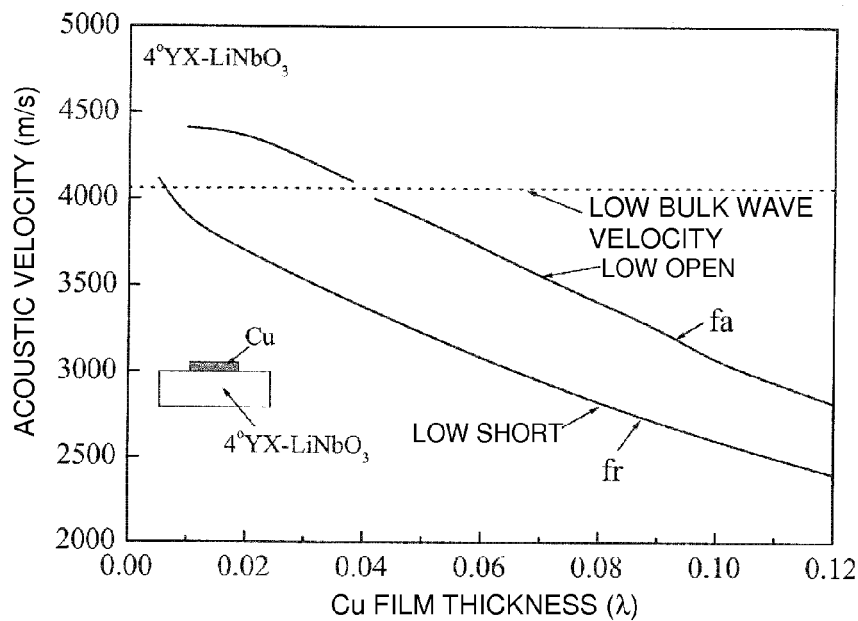
FIG. 39 is an illustration showing the relationship between resonant and anti-resonant velocities of the surface acoustic wave and the Cu film thickness of a structure in which a Cu electrode is provided on LiNbO$_3$ with Euler angles of (0°, 94°, 0°).
Figure 40:
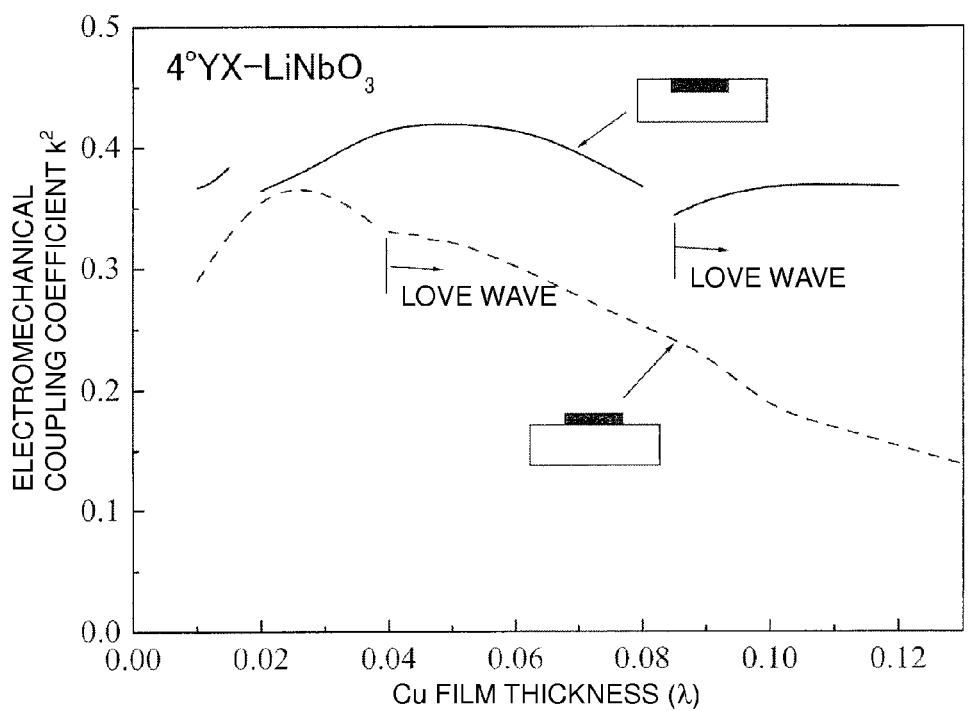
FIG. 40 is an illustration showing the relationship between the electromechanical coupling coefficient and the Cu film thickness of a structure in which the Cu electrode is provided on LiNbO$_3$ with the Euler angles of (0°, 94°, 0°) and of a structure in which the Cu electrode is embedded in a groove in a LiNbO$_3$ substrate.
Figure 41:
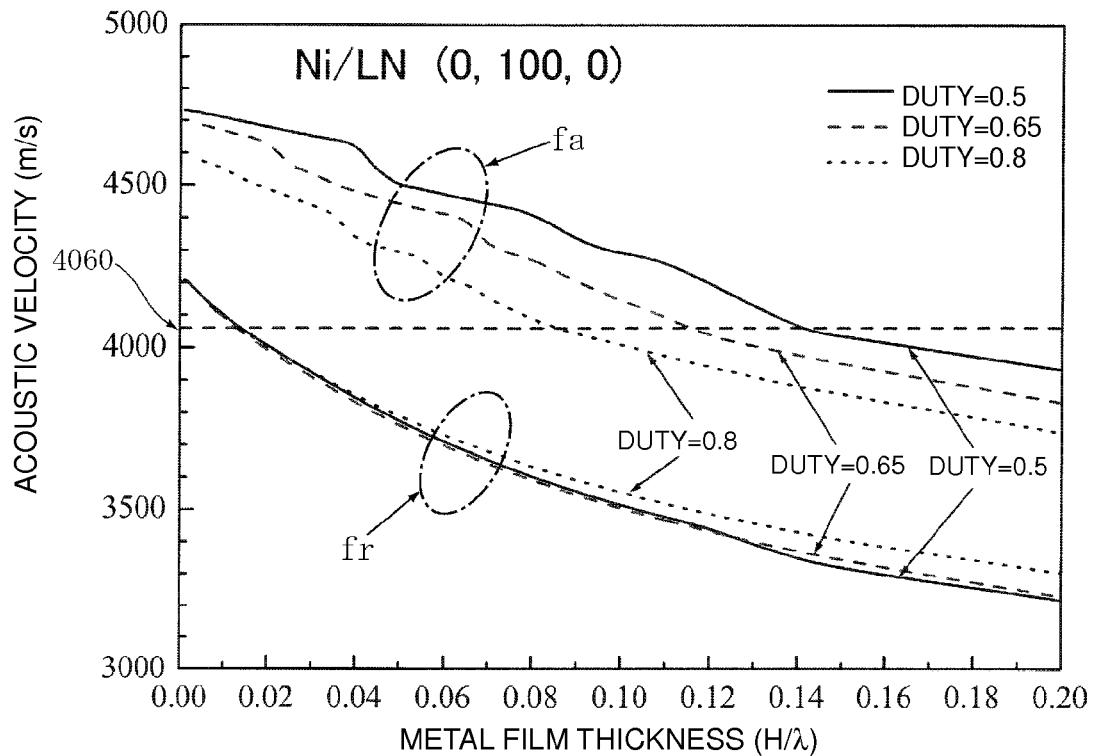
FIG. 41 is an illustration showing Ni-film-thickness dependence of resonant and anti-resonant frequency acoustic velocity with various duties of a structure in which a Ni electrode is embedded in LiNbO$_3$ with the Euler angles of (0°, 100°, 0°).
Figure 42:
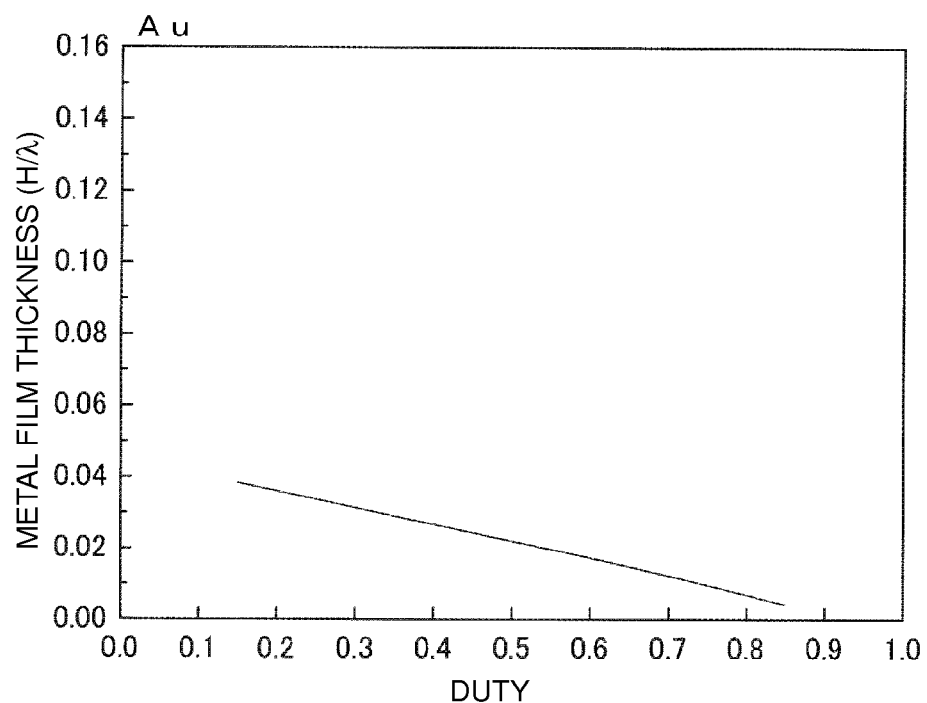
FIG. 42 is an illustration showing the relationship between the duty of a structure in which an Au electrode is embedded in LiNbO$_3$ with the Euler angles of (0°, 100°, 0°), and the lower limit value of the Au film thickness.
Figure 43:
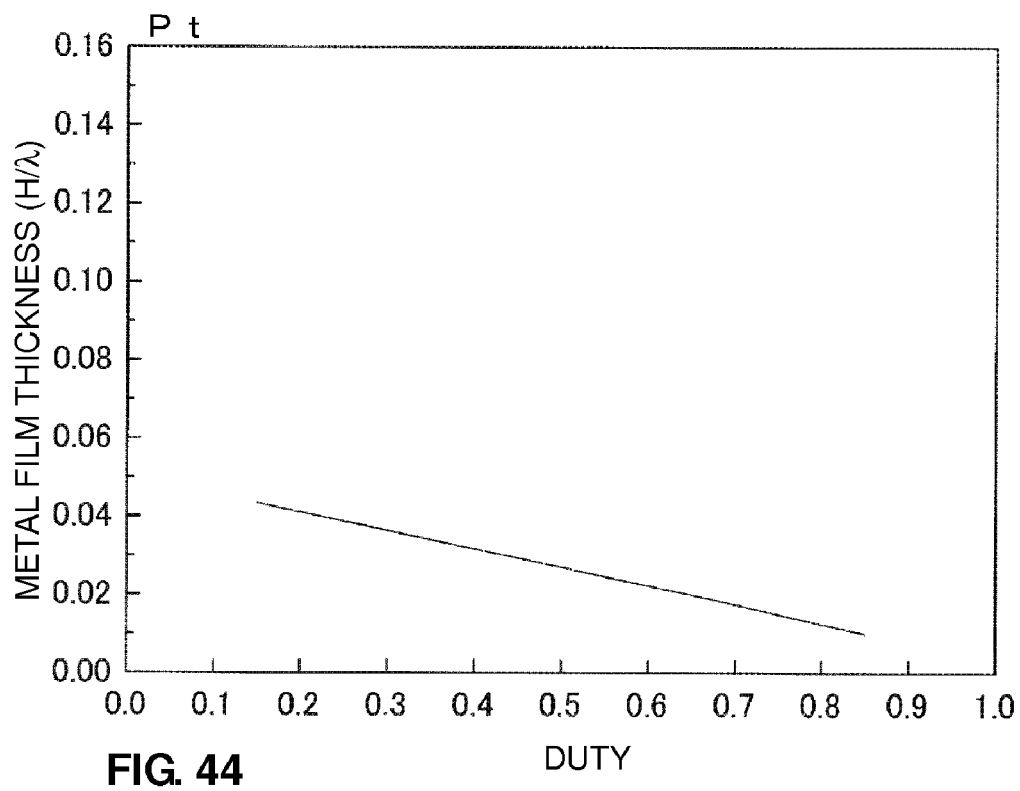
FIG. 43 is an illustration showing the relationship between the duty of a structure in which a Pt electrode is embedded in LiNbO$_3$ with the Euler angles of (0°, 100°, 0°), and the lower limit value of the Pt film thickness.
Figure 44:
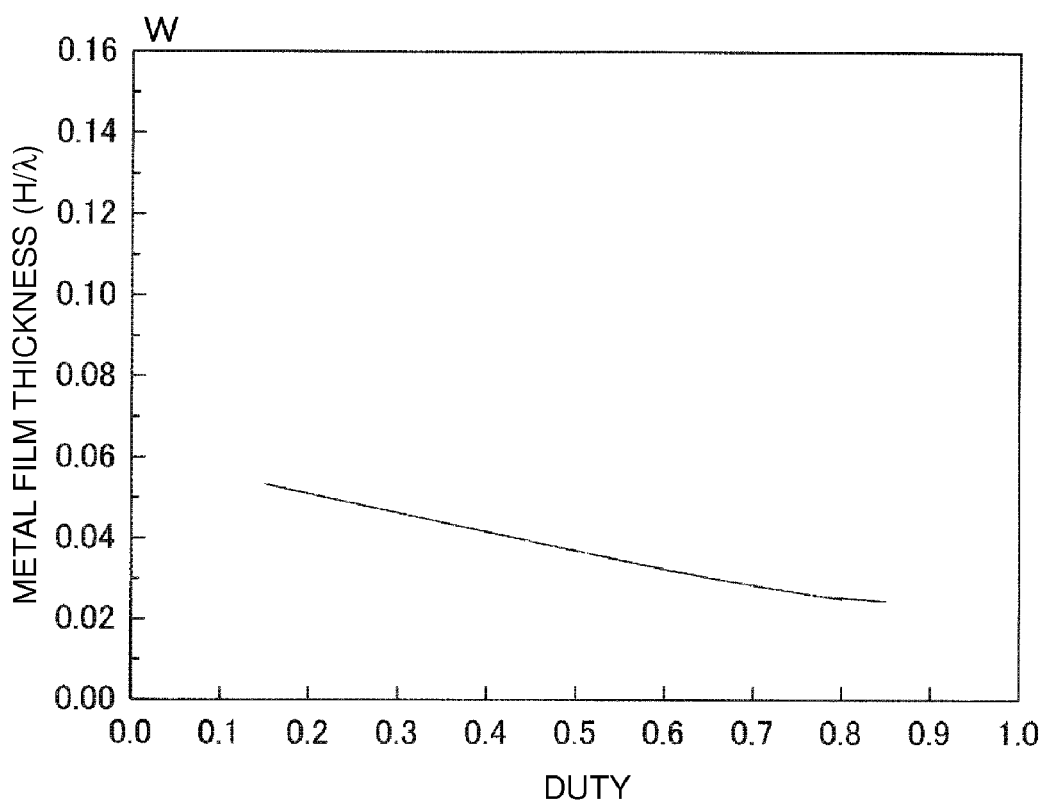
FIG. 44 is an illustration showing the relationship between the duty of a structure in which a W electrode is embedded in LiNbO$_3$ with the Euler angles of (0°, 100°, 0°), and the lower limit value of the W film thickness.
Figure 45:
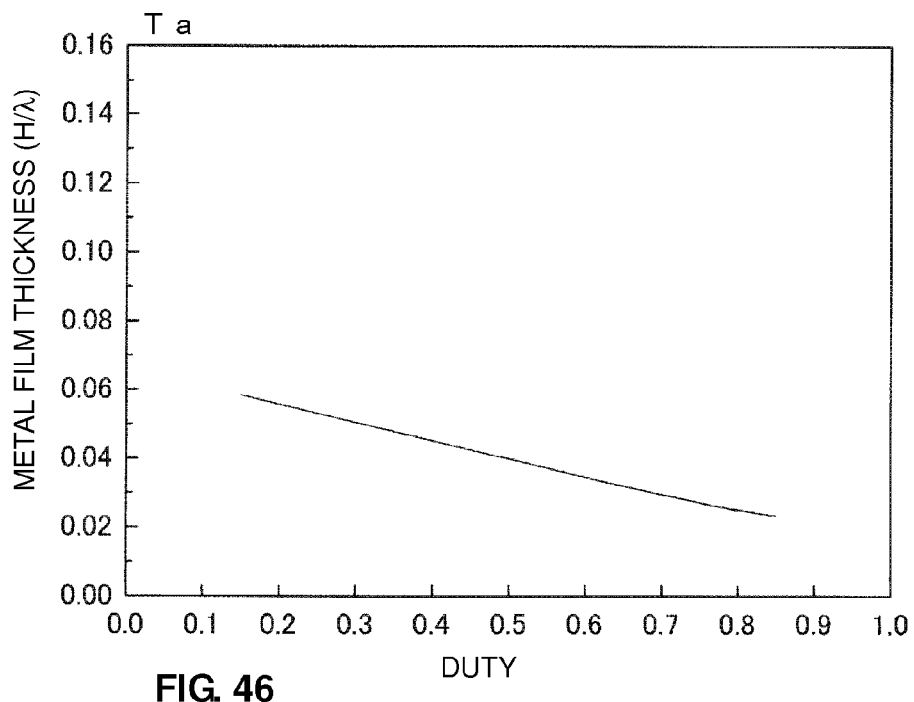
FIG. 45 is an illustration showing the relationship between the duty of a structure in which a Ta electrode is embedded in LiNbO$_3$ with the Euler angles of (0°, 100°, 0°), and the lower limit value of the Ta film thickness.
Figure 46:
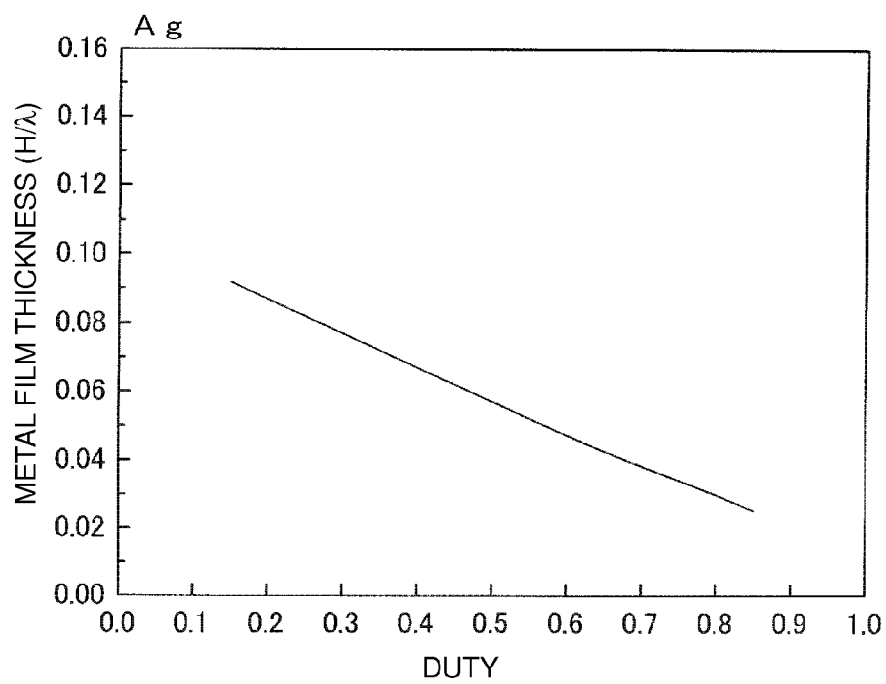
FIG. 46 is an illustration showing the relationship between the duty of a structure in which a Ag electrode is embedded in LiNbO$_3$ with the Euler angles of (0°, 100°, 0°), and the lower limit value of the Ag film thickness.
Figure 47:
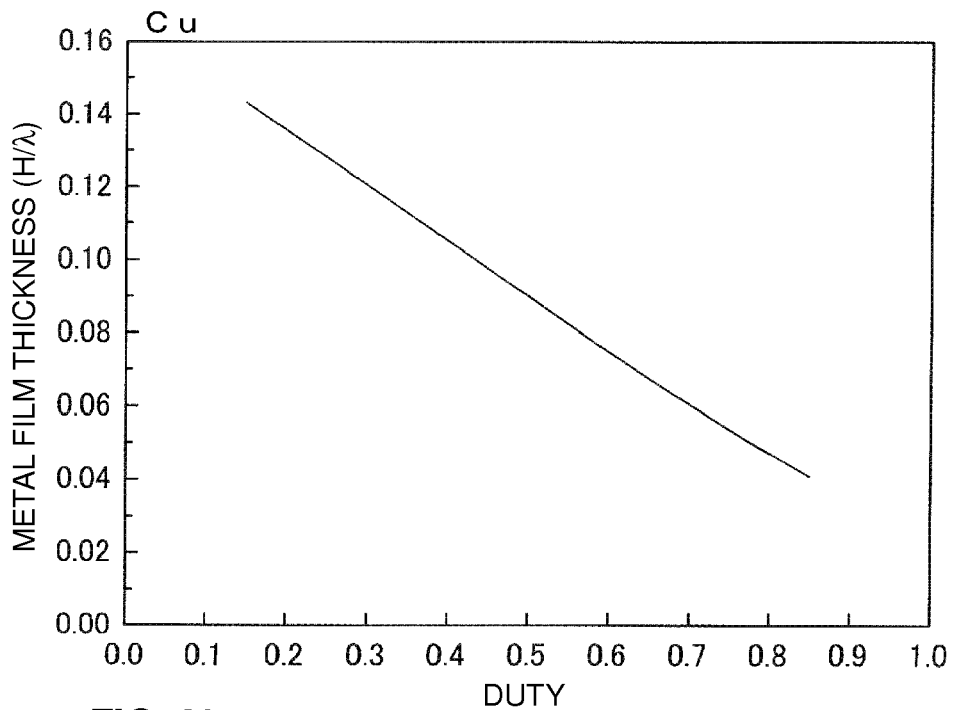
FIG. 47 is an illustration showing the relationship between the duty of a structure in which a Cu electrode is embedded in LiNbO$_3$ with the Euler angles of (0°, 100°, 0°), and the lower limit value of the Cu film thickness.
Figure 48:
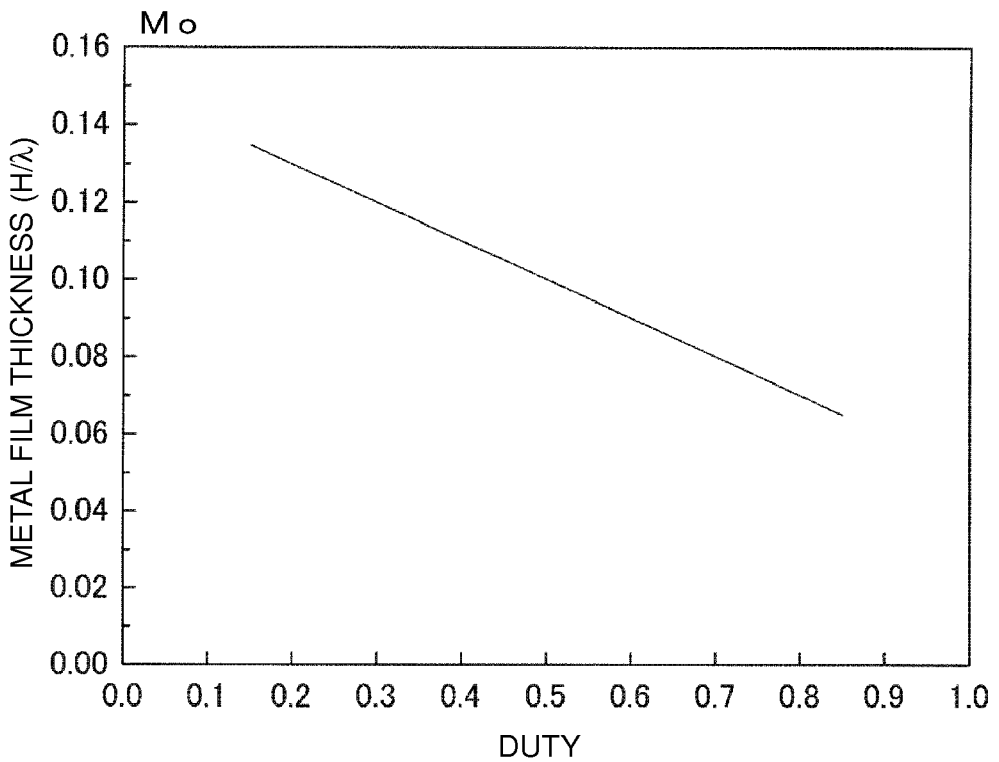
FIG. 48 is an illustration showing the relationship between the duty of a structure in which a Mo electrode is embedded in LiNbO$_3$ with the Euler angles of (0°, 100°, 0°), and the lower limit value of the Mo film thickness.
Figure 49:
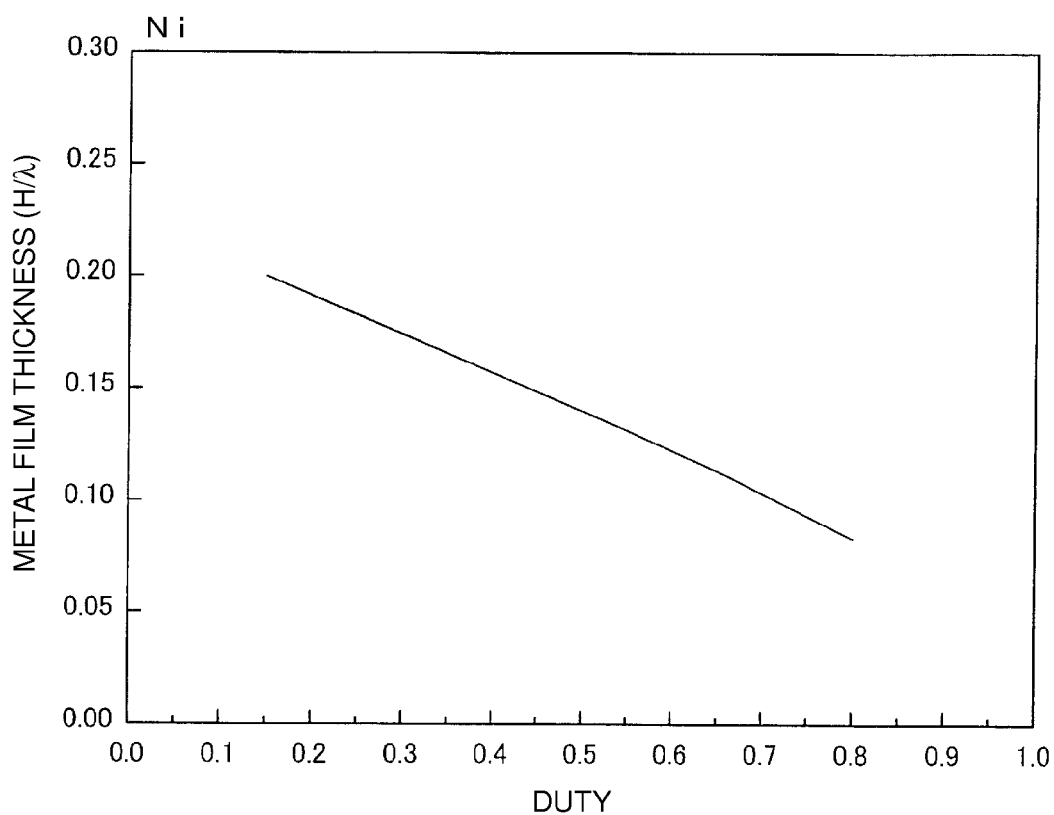
FIG. 49 is an illustration showing the relationship between the duty of a structure in which a Ni electrode is embedded in LiNbO$_3$ with the Euler angles of (0°, 100°, 0°), and the lower limit value of the Ni film thickness.

This can be also described with reference to FIG. 27. FIG. 27 shows Cu-film-thickness dependence of the acoustic velocity of a structure in which a Cu electrode with a duty of about 0.5 is embedded in LiNbO₃ with Euler angles of (0°, 100°, 0°). In FIG. 27, fa represents an upper-limit frequency of a stop band corresponding to the anti-resonant frequency when the electrode is open and fr represents a lower-limit frequency of the stop band corresponding to the resonant frequency when the electrode is short circuit, the frequencies being analyzed by a finite element method. FIG. 27 shows that the low transversal bulk wave velocity is present between the resonant frequency and the anti-resonant frequency when the normalized film thickness H/λ of the Cu electrode is within a range from about 0.01 to about 0.09, the characteristic is round and a spurious response is generated, and thus, a good frequency characteristic is not obtained. FIGS. 39 and 40 show Cu-electrode-thickness dependence of the acoustic velocity and the electromechanical coupling coefficient of a structure in which a Cu electrode is provided on LiNbO₃ with Euler angles of (0°, 94°, 0°). With the structure in which the Cu electrode is provided on the LiNbO₃ substrate as shown in FIG. 39, the low transversal wave velocity is outside the range of the resonant and anti-resonant acoustic velocities when the Cu electrode thickness H/λ is about 0.04 or greater. However, as shown in FIG. 40, the electromechanical coupling coefficient is smaller than the electromechanical coupling coefficient of the structure in which the Cu electrode is embedded in the LiNbO₃ substrate. In FIGS. 27 and 39, values of θ of the Euler angles are slightly different from each other. However, substantially the same values are obtained when θ of the Euler angles are θ=94° and θ=100°.

Figure 20:
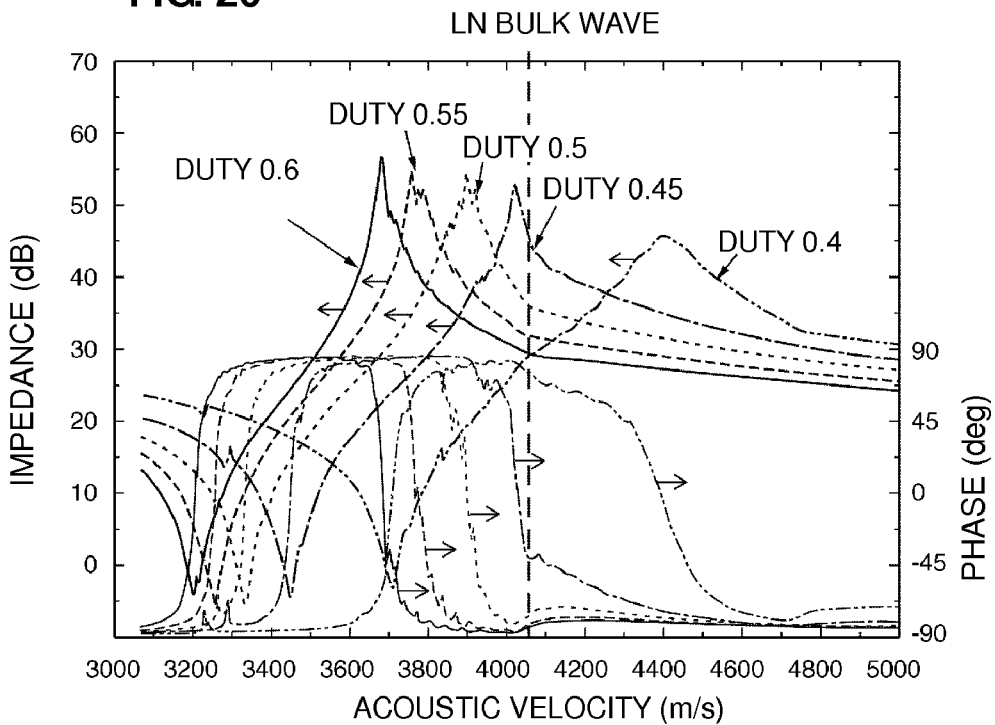
FIG. 20 is an illustration showing an impedance characteristic and a phase characteristic of a surface acoustic wave resonator when the LiNbO$_3$ substrate is used, an IDT electrode includes Cu embedded therein by a thickness H/λ of about 0.1, and the duty of the IDT electrode is about 0.4, about 0.45, about 0.5, about 0.55, or about 0.6 in Example 6.

The acoustic velocities with the resonant and anti-resonant frequencies can be controlled not only by the material of the IDT electrode and the thickness of the IDT electrode, but also by the duty of the IDT electrode. FIG. 20 is an illustration showing an impedance characteristic and a phase characteristic of the same structure as that shown in FIG. 19, when the thickness of the IDT electrode made of Cu is about 0.1, and the duty is about 0.4, about 0.45, about 0.5, about 0.55, or about 0.6.

As shown in FIG. 20, when the duty is about 0.4, the acoustic velocity of the anti-resonant frequency is greater than the low transversal bulk wave velocity. In contrast, when the duty is about 0.45, about 0.50, about 0.55, or about 0.6, the acoustic velocity of the anti-resonant frequency is less than the low transversal bulk wave velocity. The impedance characteristic around the anti-resonant frequency is sharp.

Figure 21:
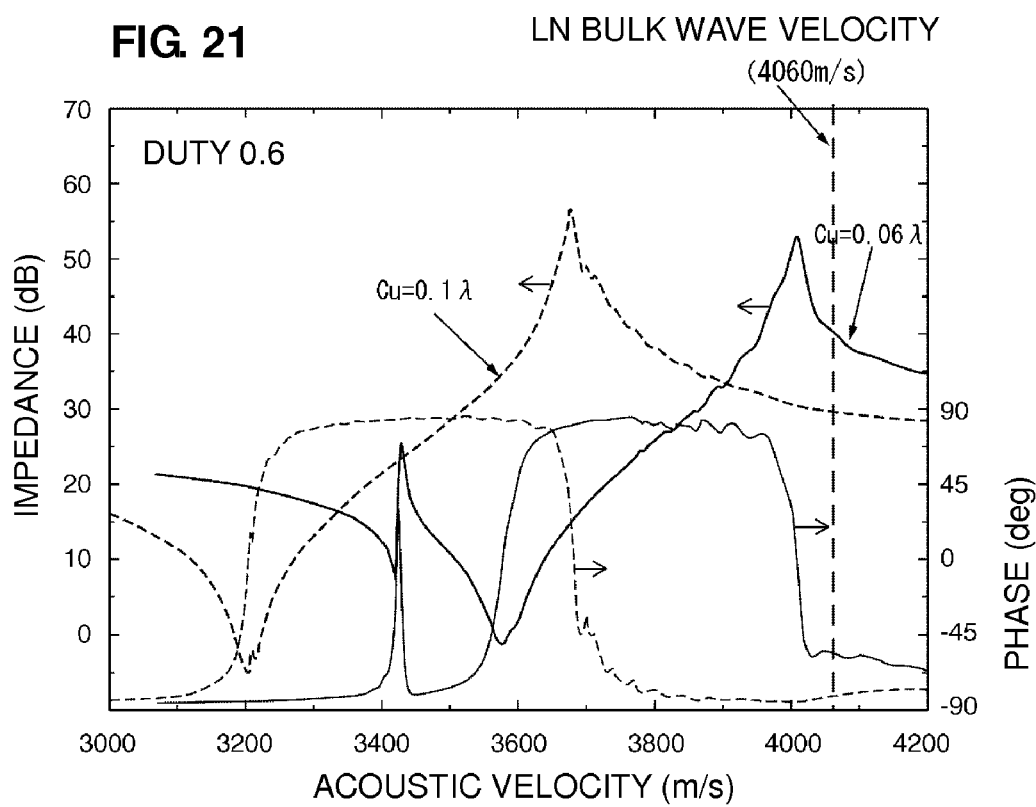
FIG. 21 is an illustration showing an impedance characteristic and a phase characteristic of a surface acoustic wave device when the LiNbO$_3$ substrate is used, the duty is about 0.6, and an IDT electrode includes Cu embedded therein by a thickness H/λ of about 0.06 or about 0.1 in Example 6.
Figure 22:
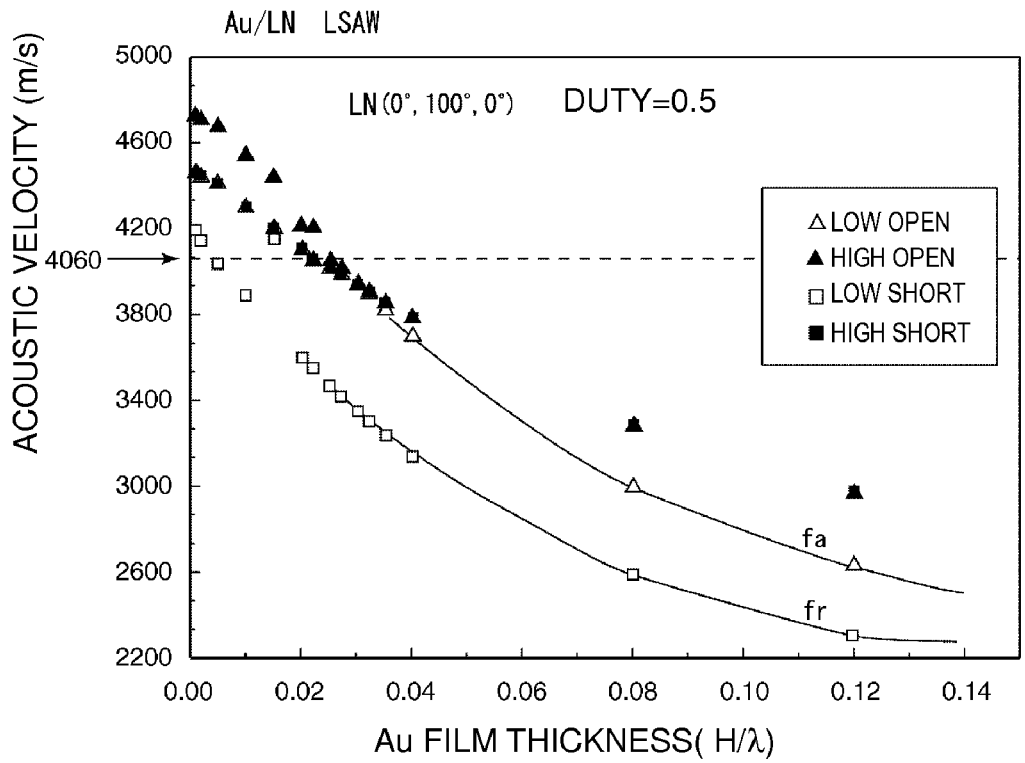
FIG. 22 is an illustration showing the relationship between the normalized film thickness H/λ of an IDT electrode and the surface acoustic wave velocity when a LiNbO$_3$ substrate with Euler angles of (0°, 100°, 0°), i.e., of about 10° Y cut X propagation is used, the IDT electrode includes Au embedded therein, and the duty is about 0.5 in Example 6.
Figure 23:
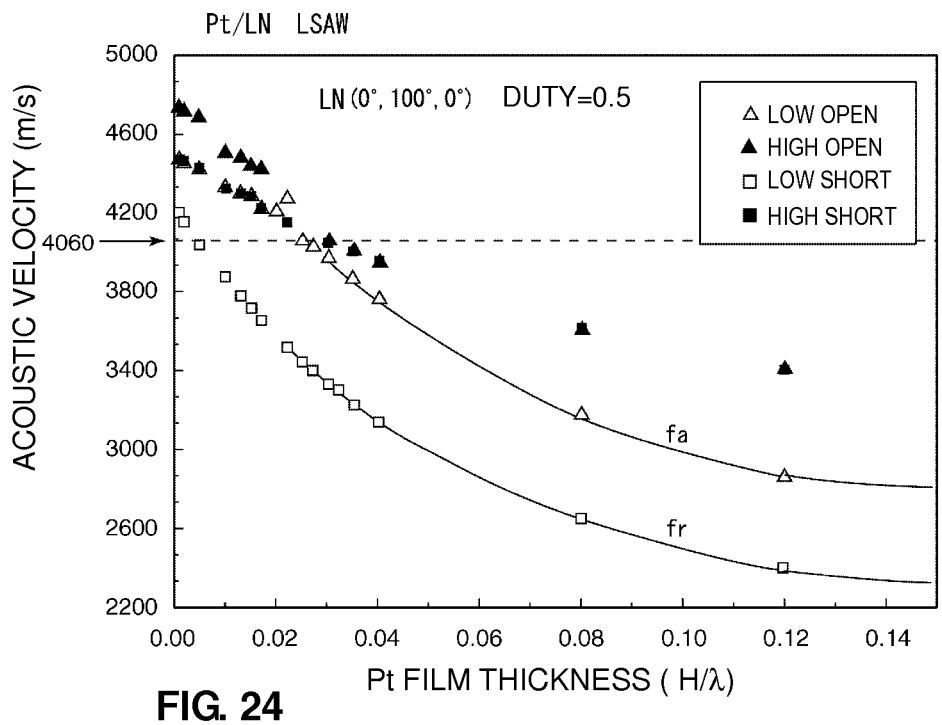
FIG. 23 is an illustration showing the relationship between the normalized film thickness H/λ of an IDT electrode and the surface acoustic wave velocity when the LiNbO$_3$ substrate with the Euler angles of (0°, 100°, 0°), i.e., of about 10° Y cut X propagation is used, the IDT electrode includes Pt embedded therein, and the duty is about 0.5 in Example 6.
Figure 24:
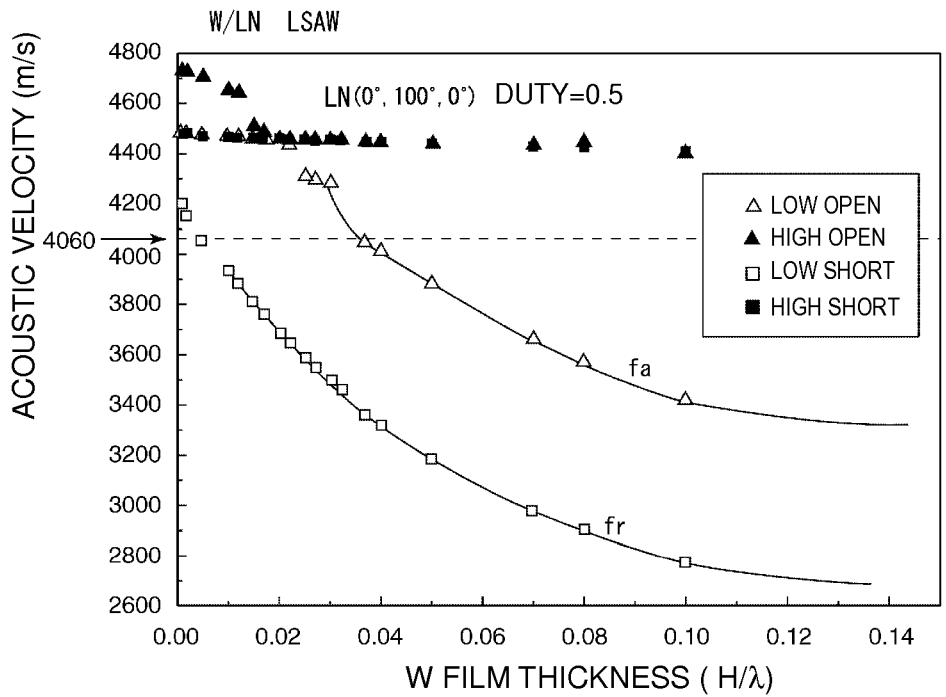
FIG. 24 is an illustration showing the relationship between the normalized film thickness H/λ of an IDT electrode and the surface acoustic wave velocity when the LiNbO$_3$ substrate with the Euler angles of (0°, 100°, 0°), i.e., of about 10° Y cut X propagation is used, the IDT electrode includes W embedded therein, and the duty is about 0.5 in Example 6.
Figure 25:
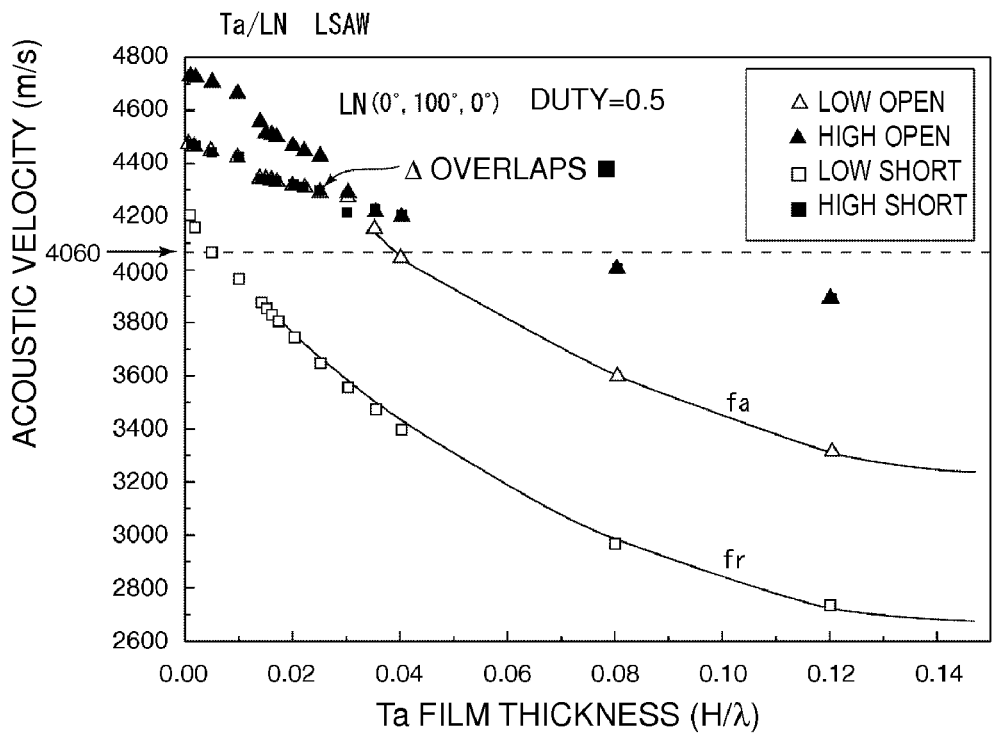
FIG. 25 is an illustration showing the relationship between the normalized film thickness H/λ of an IDT electrode and the surface acoustic wave velocity when the LiNbO$_3$ substrate with the Euler angles of (0°, 100°, 0°), i.e., of about 10° Y cut X propagation is used, the IDT electrode includes Ta embedded therein, and the duty is about 0.5 in Example 6.
Figure 26:
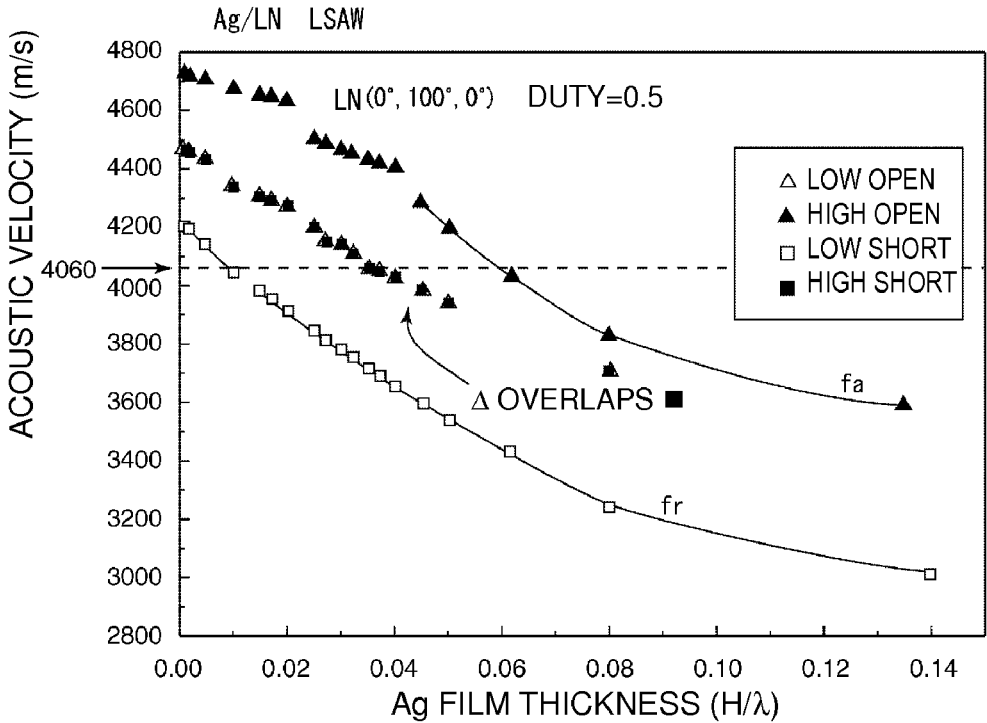
FIG. 26 is an illustration showing the relationship between the normalized film thickness H/λ of an IDT electrode and the surface acoustic wave velocity when the LiNbO$_3$ substrate with the Euler angles of (0°, 100°, 0°), i.e., of about 10° Y cut X propagation is used, the IDT electrode includes Ag embedded therein, and the duty is about 0.5 in Example 6.

FIG. 21 is an illustration showing an impedance characteristic and a phase characteristic of the same structure as that shown in FIG. 19, when the duty of the IDT electrode made of Cu is about 0.6. As shown in FIG. 19, when the thickness H/λ of the IDT electrode made of Cu is about 0.06, if the duty is about 0.5, the acoustic velocity of the anti-resonant frequency is greater than the transversal bulk wave velocity. In contrast, as shown in FIG. 21, even when the thickness H/λ of the IDT electrode made of Cu is about 6% of the wavelength, i.e., about 0.06, if the duty is about 0.6, the acoustic velocity of the anti-resonant frequency is less than the transversal bulk wave velocity. As described above, the acoustic velocity of the anti-resonant frequency can become less than the transversal bulk wave velocity by increasing the duty, instead of changing the type of metal of the IDT electrode and the thickness of the IDT electrode. Accordingly, when the Cu thickness H/λ is about 0.1, the duty is preferably about 0.45 or greater, for example, and when the Cu thickness H/λ is about 0.06, the duty is preferably about 0.6 or greater, for example. The duty is preferably about 0.87 or less, for example. If the duty is greater than about 0.87, the electrode may be short circuit. In the resonator structure, frequencies or acoustic velocities at the upper limit and the lower limit of the stop band when the electrode is open and frequencies or acoustic velocities at the upper limit and the lower limit of the stop band when the electrode is short circuit can be calculated by a finite element method. Two of the four acoustic velocities substantially correspond to each other, a higher acoustic velocity of the remaining two acoustic velocities corresponds to the acoustic velocity with the anti-resonant frequency, and the lower acoustic velocity corresponds to the acoustic velocity with the resonant frequency. Thus, to obtain a good resonator with a sharp impedance characteristic with the anti-resonant frequency as described above, the transversal bulk wave velocity is prevented from being present between the acoustic velocities corresponding to the limits of the stop band corresponding to the resonant and anti-resonant frequencies. Therefore, to obtain a tunable filter with a good characteristic, a resonator that satisfies this condition is preferably provided.

Since a tunable filter uses a lower frequency than an anti-resonant frequency, a resonant characteristic may not be sharp in a portion with frequencies that are less than the anti-resonant frequency by about 10% in practical use. That is, the acoustic velocity with the anti-resonant frequency may be greater than the transversal bulk wave velocity by about 10%, or the acoustic velocity with the resonant frequency may be less than the transversal bulk wave velocity.

FIGS. 22 to 28, and 41 are illustrations each showing the relationship between the normalized film thickness H/λ of an IDT electrode in a surface acoustic wave device with the structure shown in FIG. 1D in which the IDT electrode is defined by embedding Au, Pt, W, Ta, Ag, Cu, Mo, or Ni, for example, in grooves in an upper surface of $LiNbO_3$ of 10° Y cut X propagation, i.e., with Euler angles of (0°, 100°, 0°), for example, and the acoustic velocities of the surface acoustic wave at the upper and lower limits of a stop band when the electrode is open and at the upper and lower limits of the stop band when the electrode is short circuit. In any case, the duty of the IDT electrode is about 0.5. In FIGS. 22 to 28, fr represents the acoustic velocity corresponding to the resonant frequency, and fa represents the acoustic velocity corresponding to the anti-resonant frequency. A broken line at about 4060 m/s represents the transversal bulk wave velocity.

As shown in FIGS. 22 to 28, and 41, it was determined that good resonant characteristics are obtained when the normalized thicknesses H/λ of the electrodes made of Au, Pt, W, Ta, Ag, Cu, Mo, and Ni are preferably about 0.022 or greater, about 0.027 or greater, about 0.037 or greater, about 0.04 or greater, about 0.06 or greater, about 0.09 or greater, about 0.10 or, and about 0.14 or larger, respectively, for example. The allowable range in practical use is a range with values smaller than the aforementioned values by about 10%. Thus, characteristics that are allowable in practical use can be obtained when the values are about 0.02 or greater, about 0.024 or greater, about 0.033 or greater, about 0.036 or greater, about 0.051 or greater, about 0.081 or greater, about 0.09 or greater, and about 0.126 or greater, respectively.

In FIGS. 22 to 28, and 41, the upper limit of the normalized thickness H/λ of the IDT electrode is about 0.14 or about 0.2. However, substantially the same value is obtained even when the normalized thickness H/λ exceeds about 0.14 as long as the value is about 0.3 or less, and all of the anti-resonant frequencies fa are the transversal wave velocity or lower. If the thickness H/λ of the IDT electrode exceeds about 0.30, it may be difficult to manufacture an electrode made of a high-density metal.

If the duty of the IDT electrode is relatively large, the film thickness of the IDT electrode may be small as shown in FIGS. 20 and 21. For example, regarding the IDT electrode made of Ni in FIG. 41, if the duty is about 0.65, the thickness H/λ of the IDT electrode may preferably be about 0.125 or greater, for example, and in practical use, it may preferably be about 0.112 or greater, for example. If the duty is about 0.8, the thickness H/λ of the IDT electrode may preferably be about 0.085 or greater, for example, and in practical use, it may preferably be about 0.077 or greater, for example. The lower limit value of the film thickness with respect to the duty is as shown in FIGS. 42 to 49. The duty may preferably be in a range from about 0.15 to about 0.85, for example. More preferably, the duty may be about 0.5 or greater. The duty that is in the range from about 0.15 to about 0.85 or that is about 0.5 or greater and the lower limit of the electrode film thickness are preferably values shown in FIGS. 42 to 49 and Table 1 (described above), for example, the upper limit is preferably one of values shown in Table 1, and the upper limit is preferably one of the values shown in Table 1, for example. It is to be noted that the upper limit of the film thickness may be smaller by about 10% in practical use as described above. Also, even when cut-angles of the $LiNbO_3$ substrate are changed, a variation in acoustic velocity is substantially the same. Thus, the preferable thickness of the IDT electrode is substantially the same.

Figure 29:
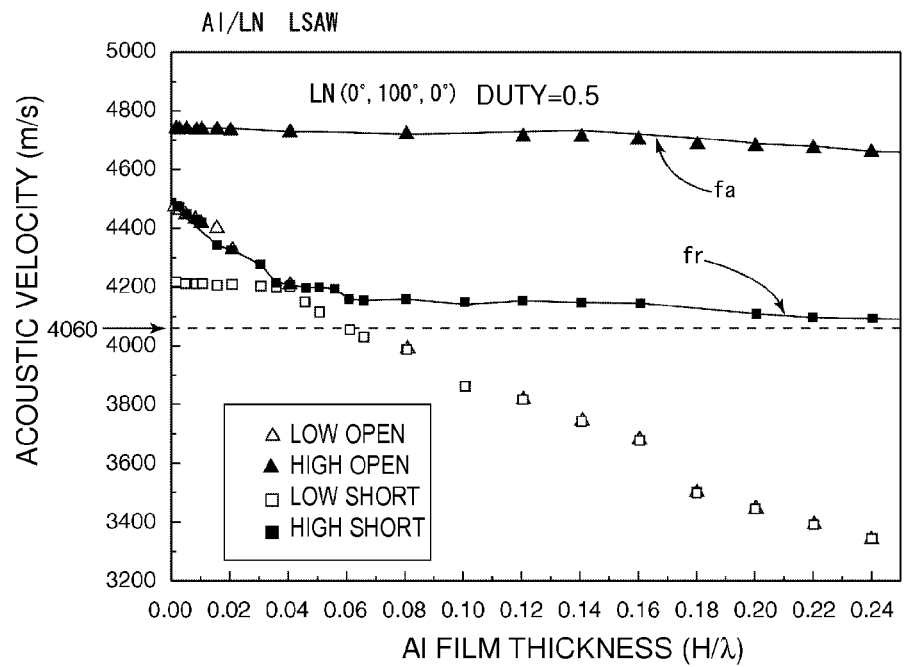
FIG. 29 is an illustration showing the relationship between the normalized film thickness H/λ of an IDT electrode and the surface acoustic wave velocity when the LiNbO$_3$ substrate with the Euler angles of (0°, 100°, 0°), i.e., of about 10° Y cut X propagation is used, the IDT electrode includes Al embedded therein, and the duty is about 0.5 in Example 6.

However, only the IDT electrode made of Al behaves exceptionally. With each of the IDT electrodes made of the respective materials shown in FIGS. 22 to 28, the acoustic velocity corresponding to the resonant frequency fr and the acoustic velocity corresponding to the anti-resonant frequency fa are rapidly changed from a higher velocity region than the region of the transversal bulk wave velocity to a lower velocity region than the region of the transversal bulk wave velocity if the thickness of the IDT electrode is changed. In contrast, as shown in FIG. 29, when the IDT electrode is made of Al, the acoustic velocity corresponding to the resonant frequency and the acoustic velocity corresponding to the anti-resonant frequency are greater than the transversal bulk wave velocity regardless of the thickness of the electrode. Therefore, it is conceivable that degradation of characteristics does not appear between the resonant frequency and the anti-resonant frequency because the transversal bulk wave velocity is not present between the resonant acoustic velocity and the anti-resonant acoustic velocity. Broken lines in FIG. 33 indicate an impedance characteristic and a phase characteristic of a structure similar to that described above except that an IDT electrode made of Al is used and the thickness H/λ of the IDT electrode is about 0.17. As shown in FIG. 33, the impedance characteristic curve is relatively sharp at the anti-resonant frequency, and thus, a good characteristic is obtained. In particular, since the transversal bulk wave velocity is not present between the acoustic velocity with the resonant frequency and the acoustic velocity with the anti-resonant frequency, a good characteristic is obtained.

When the IDT electrode is made of Al, the thickness H/λ of the electrode is preferably in a range from about 0.04 to about 0.33, for example. The value of 0.04 is the film thickness H/λ of Al at which the acoustic velocity corresponding to the resonant frequency fr is changed from the acoustic velocity at the lower limit of a stop band when the electrode is short circuit to the acoustic velocity at the upper limit of the stop band. The value of about 0.33, although not shown, is the film thickness of Al at which the acoustic velocity corresponding to the resonant frequency fr and the acoustic velocity of which corresponding to the anti-resonant frequency fa are greater than the transversal bulk wave velocity. It is more preferable that the duty is in a range from about 0.15 to about 0.85, for example, and that both the acoustic velocity corresponding to the resonant frequency fr and the acoustic velocity corresponding to the anti-resonant frequency fa are in a range greater than the transversal bulk wave velocity. Grooves having a large duty and a small depth can be fabricated more easily than grooves having a small duty and a large depth. Thus, the duty is desirably greater than about 0.5, for example.

With Au, Pt, W, Ta, Ag, Cu, Mo, or Ni, the acoustic velocity is rapidly decreased depending on the film thickness. However, if the low transversal wave is not present between the acoustic velocities of fr and fa, a good resonant characteristic is obtained. With the structure in which the electrode is embedded in the substrate, the normalized film thickness H/λ of the electrode made of Au, Pt, W, or Ta is preferably about 0.006 or less, for example, the normalized film thickness H/λ of the electrode made of Ag is preferably about 0.01 or less, for example, or the normalized film thickness H/λ of the electrode made of Cu, Mo, or Ni is preferably about 0.013 or less, for example. Accordingly, a good characteristic can be obtained.

Thus, regarding the results shown in FIGS. 22 to 28, if the duty is greater than about 0.5, a preferable range for the thickness of the IDT electrode made of any of the above-mentioned metal materials is a range shown in Table 6.

TABLE 6

(X: Duty)

| Electrode | Lower limit of film thickness (λ) | Upper limit of film thickness (λ) |
|---|---|---|
| Au | $0.0381 - 0.0211X - 0.0222X^2$ | 0.25 |
| Pt | $0.0501 - 0.0445X - 0.0031X^2$ | 0.25 |
| W | $0.0748 - 0.0978X + 0.0444X^2$ | 0.25 |
| Ta | $0.0739 - 0.0789X + 0.0222X^2$ | 0.25 |
| Ag | $0.1287 - 0.1767X + 0.0667X^2$ | 0.25 |
| Cu | $0.1883 - 0.23X + 0.0667X^2$ | 0.25 |
| Mo | $0.1497 - 0.0990X$ | 0.25 |
| Ni | $0.22112 - 0.13613X + 0.0439X^2$ | 0.25 |

Also, a more preferable range is shown in Table 7.

TABLE 7

(X: Duty)

| Electrode | Lower limit of film thickness (λ) | Upper limit of film thickness (λ) |
|---|---|---|
| Au | $0.0343 - 0.0190X - 0.0200X^2$ | 0.25 |
| Pt | $0.0451 - 0.0401X - 0.0028X^2$ | 0.25 |
| W | $0.0673 - 0.0880X + 0.040X^2$ | 0.25 |
| Ta | $0.0665 - 0.0710X + 0.020X^2$ | 0.25 |
| Ag | $0.1158 - 0.1590X + 0.060X^2$ | 0.25 |
| Cu | $0.1695 - 0.207X + 0.060X^2$ | 0.25 |
| Mo | $0.1347 - 0.0891X$ | 0.25 |
| Ni | $0.1997 - 0.1259X + 0.0358X^2$ | 0.25 |

Figure 30:
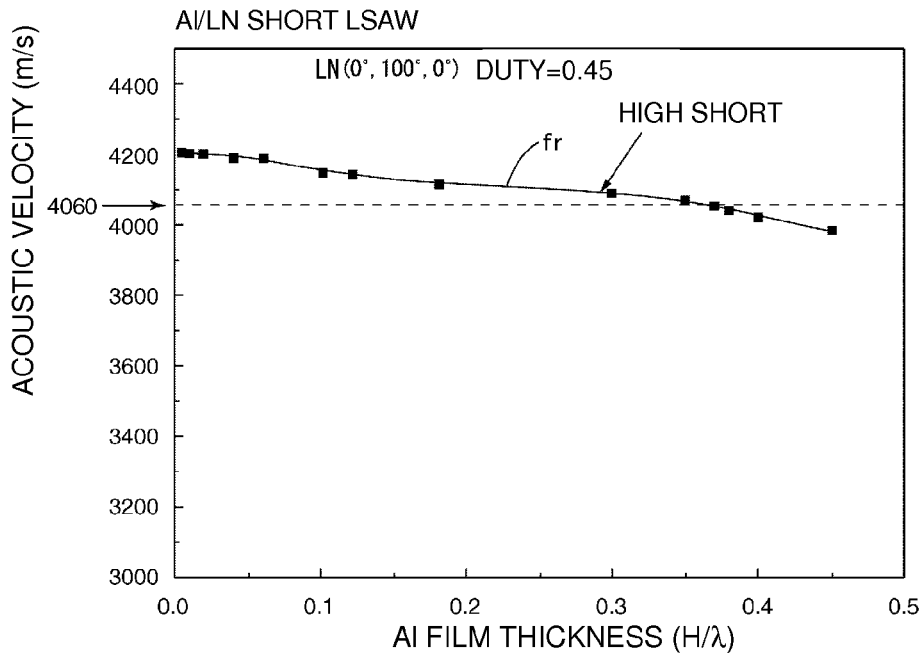
FIG. 30 is an illustration showing the relationship between the normalized film thickness H/λ of an IDT electrode and the surface acoustic wave velocity corresponding to fr when the LiNbO$_3$ substrate with the Euler angles of (0°, 100°, 0°), i.e., of about 10° Y cut X propagation is used, the IDT electrode includes Al embedded therein, and the duty is about 0.45 in Example 6.
Figure 31:
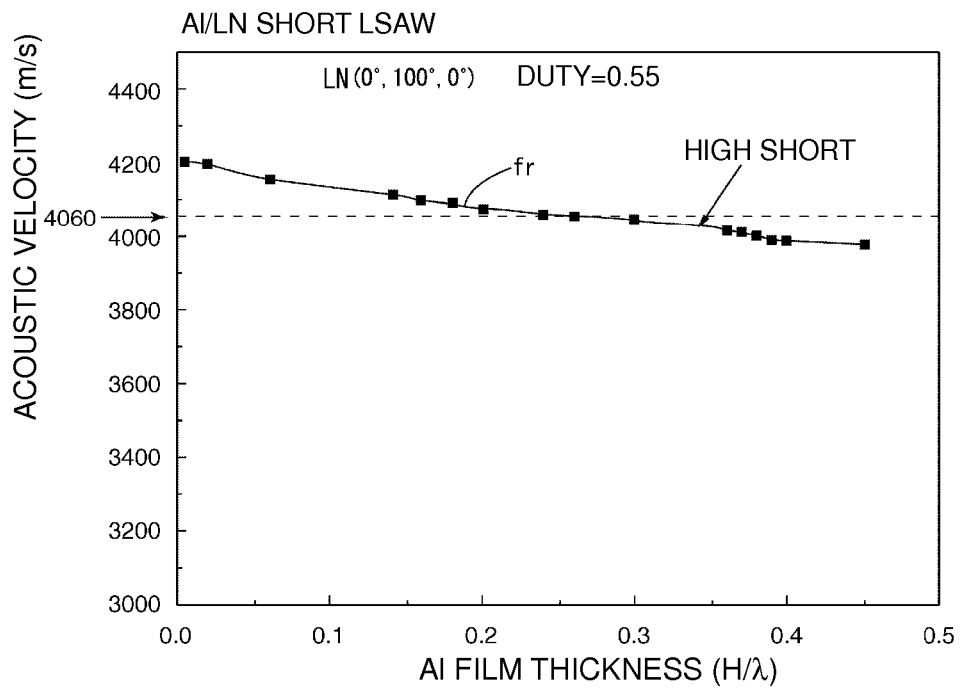
FIG. 31 is an illustration showing the relationship between the normalized film thickness H/λ of an IDT electrode and the surface acoustic wave velocity corresponding to fr when the LiNbO$_3$ substrate with the Euler angles of (0°, 100°, 0°), i.e., of about 10° Y cut X propagation is used, the IDT electrode includes Al embedded therein, and the duty is about 0.55 in Example 6.
Figure 32:
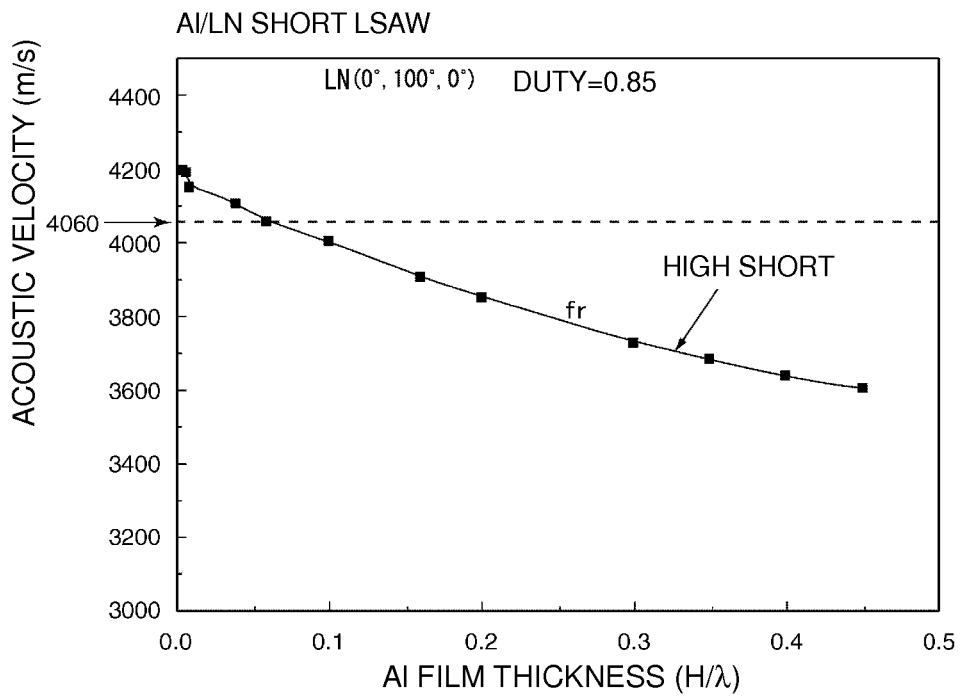
FIG. 32 is an illustration showing the relationship between the normalized film thickness H/λ of an IDT electrode and the surface acoustic wave velocity corresponding to fr when the LiNbO$_3$ substrate with the Euler angles of (0°, 100°, 0°), i.e., of about 10° Y cut X propagation is used, the IDT electrode includes Al embedded therein, and the duty is about 0.85 in Example 6.

FIGS. 30 to 32 are illustrations each showing the relationship between the film thickness H/λ of a metal film made of Al that defines an IDT electrode and the acoustic velocity of the surface acoustic wave of a surface acoustic wave device that is provided by filling grooves provided in a LiNbO$_3$ substrate with Euler angles of (0°, 100°, 0°) with Al when the duty of the IDT electrode made of Al is about 0.45, about 0.55, or about 0.85. FIGS. 30 to 32 show the result of the acoustic velocity corresponding to the resonant frequency at the upper limit of a stop band when the electrode is short circuit. The anti-resonant frequency is greater than the resonant frequency. Thus, FIGS. 30 to 32 show conditions that do not produce a spurious response between the resonant frequency and the anti-resonant frequency when the resonant frequency is greater than the transversal bulk wave velocity.

In general, unless both the acoustic velocities corresponding to the resonant and anti-resonant frequencies are the transversal bulk wave velocity or less, a good characteristic is not obtained because a leaky surface wave is provided. However, it was discovered for the first time that a good resonant characteristic is obtained if the transversal bulk wave velocity is not present between the resonant and anti-resonant frequencies.

As shown in FIG. 30, it was determined that the velocity corresponding to the resonant frequency fr is about 4060 m/s when the duty is about 0.45 and the IDT electrode made of Al has a normalized film thickness of about 0.37, i.e., around a thickness of about 0.37λ. Similarly, it was determined that the acoustic velocity of the surface acoustic wave is the transversal bulk wave velocity of about 4060 m/s, when the duty is about 0.55 and the normalized film thickness H/λ of the IDT electrode made of Al is about 0.25 as shown in FIG. 31, and when the duty is about 0.85 and the normalized film thickness H/λ of the IDT electrode made of Al is about 0.065 as shown in FIG. 32.

As shown in FIGS. 30 to 32, when the IDT electrode is made of Al, if the IDT electrode has a thickness H/λ in a range from about 0.04 to about 0.37, the duty may be about 0.45 or less. Also, if the IDT electrode has a normalized film thickness H/λ in a range from about 0.04 to about 0.029, the duty may be about 0.55, i.e., may be 0.55 or greater.

Figure 50:
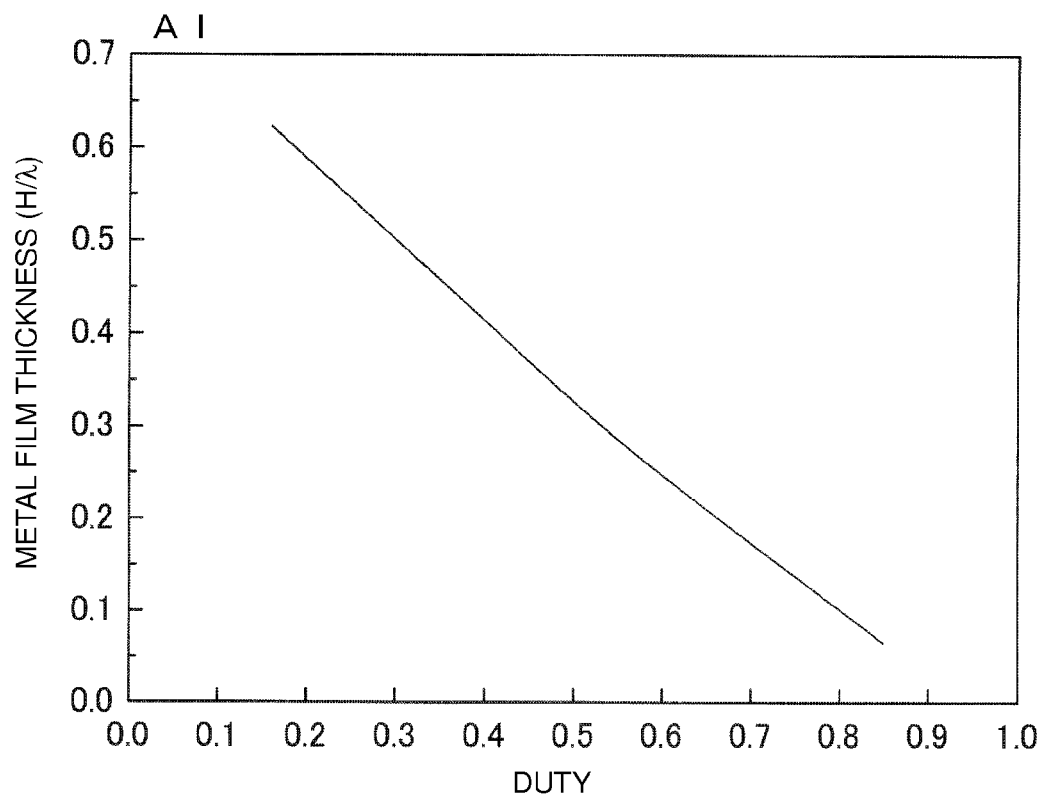
FIG. 50 is an illustration showing the relationship between the duty of a structure in which an Al electrode is embedded in LiNbO$_3$ with the Euler angles of (0°, 100°, 0°), and the upper limit value of the Al film thickness.

FIG. 50 shows the duty and the upper limit value of the film thickness of the Al electrode. This value satisfies an expression of Y=−0.9X+0.766 where X is a duty and Y is a thickness of Al. Thus, the film thickness H/λ of the Al electrode is preferably about 0.04 or greater, for example, and the upper limit is a value that satisfies this expression or less.

The upper limit of the duty is preferably about 0.85, for example. If the upper limit exceeds about 0.85, the formation of an electrode may be difficult.

Thus, the preferable range of the film thickness of the IDT electrode in which Al or an Al alloy is embedded in the LiNbO$_3$ substrate is a range shown in Table 8 based on FIGS. 29 to 32, and 50.

TABLE 8

(Y: Al film thickness, X: Duty)

| Electrode | Lower limit | Upper limit |
|---|---|---|
| Al | 0.036 λ | Y = −0.9X + 0.766 |

Also, a more preferable range is shown in Table 9.

TABLE 9

(Y: Al film thickness, X: Duty)

| Electrode | Lower limit | Upper limit |
|---|---|---|
| Al | 0.036 λ | Y = −0.81X + 0.689 |

Even when the electrode made of Au, Pt, W, Ta, Ag, Cu, Mo, or Ni is embedded in the LN substrate, if both of the acoustic velocities corresponding to the resonant frequency and anti-resonant frequency are less than the low transversal wave velocity, a resonator without a spurious response due to the low transversal wave can be obtained. In this case, the electrode made of Au, Pt, W, or Ta preferably has a normalized film thickness H/λ of about 0.006 or less, the electrode made of Ag preferably has a normalized film thickness H/λ of about 0.01 or less, or the electrode made of Cu, Mo, or Ni preferably has a normalized film thickness H/λ of about 0.013 or less, for example. Accordingly, a good characteristic with a small spurious response can be obtained.

Figure 34:
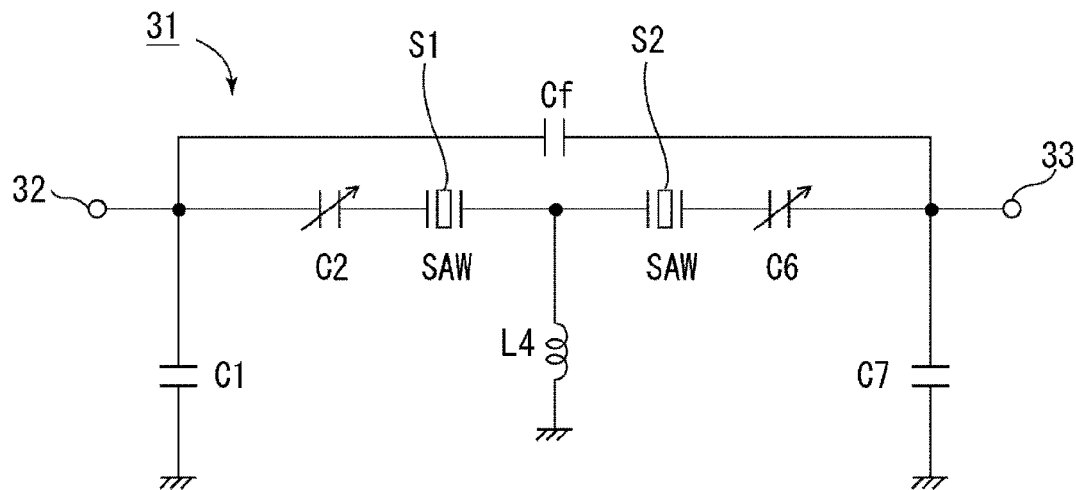
FIG. 34 is a circuit diagram of a tunable filter according to a second preferred embodiment of the present invention.

FIG. 34 is a circuit diagram of a tunable filter according to another preferred embodiment of the present invention. In a tunable filter 31 shown in FIG. 34, series-arm resonators S1 and S2 are preferably connected in series with each other in a series arm that couples an input terminal 32 and an output terminal 33 to each other. A variable capacitor C2 is preferably connected in series with the series-arm resonator S1 at the input side of the series-arm resonator S1. A parallel arm that couples the series arm and a ground potential with each other is preferably provided at the input side of the series-arm resonator S1. A capacitor C1 is preferably connected with the parallel arm.

A second parallel arm is preferably provided between a node of the series-arm resonators S1 and S2 and the ground potential. An inductance L4 is preferably inserted into the second parallel arm. Also, a variable capacitor C6 is preferably connected at the output side of the series-arm resonator S2. Further, a third parallel arm preferably couples the output terminal 3 and the ground potential with each other. A capacitor C7 is preferably connected with the third parallel arm.

In addition, in the tunable filter 31, a capacitor Cf is preferably inserted in parallel into the series arm that couples the input terminal 32 and the output terminal 33 to each other.

The tunable filter 31 in FIG. 34 is similar to the tunable filter 21 in FIG. 3 except that the capacitor Cf is provided.

Figure 35:
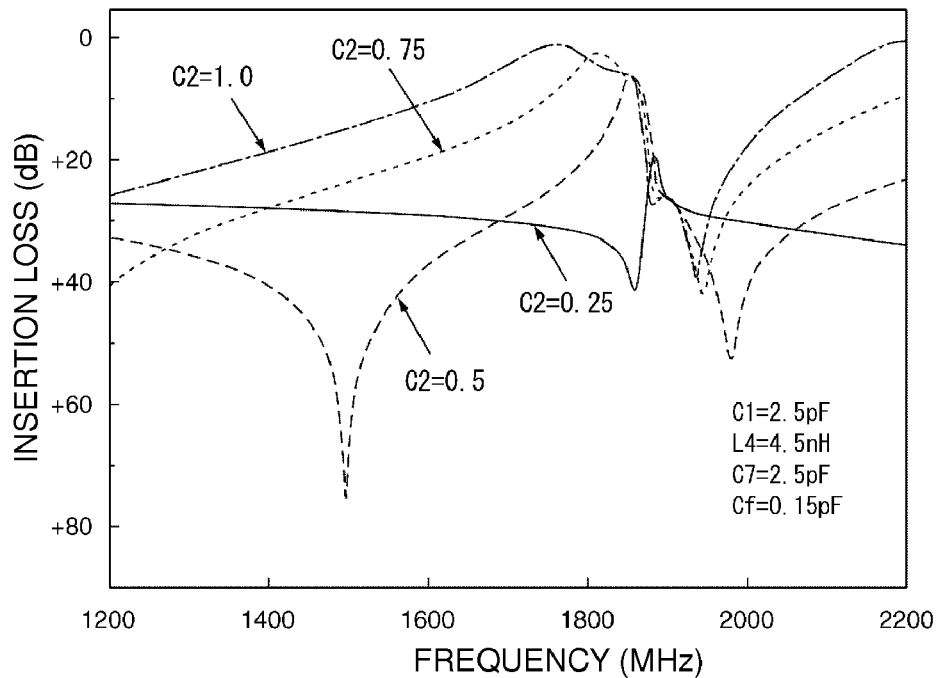
FIG. 35 is an illustration showing a change in filter characteristic of the tunable filter according to the second preferred embodiment of the present invention when, in the tunable filter, the capacities of variable capacitors C2 and C6 are equivalent to each other, and the capacity of the variable capacitor C2 is about 0.25 pF, about 0.5 pF, about 0.75 pF, or about 1.0 pF.
Figure 36:
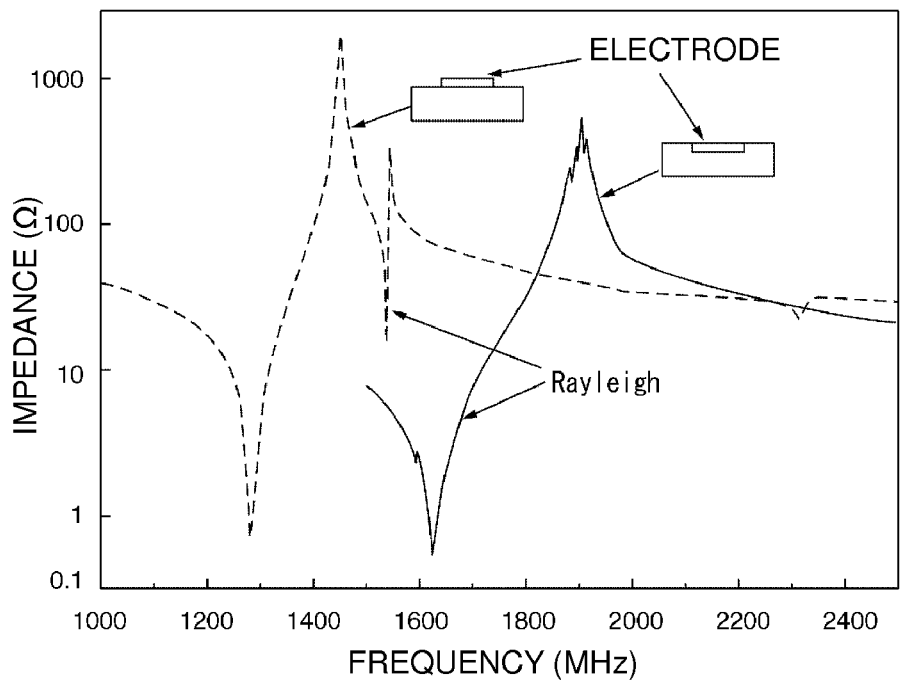
FIG. 36 is an illustration showing impedance characteristics of a surface acoustic wave resonator including an IDT electrode that is defined by a groove provided in a piezoelectric substrate filled with metal, and a surface acoustic wave resonator including an IDT electrode that is defined by metal provided on an upper surface of a piezoelectric substrate.

Surface acoustic wave resonators with a characteristic indicated by a solid line in FIG. 36, or more particularly, the surface acoustic wave resonators each having a thickness H/λ of an IDT electrode made of Cu is about 0.1 and a duty of about 0.6 are preferably used as the series-arm resonators S1 and S2, and thus, the tunable filter 31 is provided. FIG. 35 shows a characteristic of the tunable filter 31 in this case. As shown in FIG. 35, by determining the electrostatic capacities of the capacitors C2 and C6 to be equivalent to each other, and the electrostatic capacities are increased to about 0.5 pF, about 0.75 pF, and about 1.0 pF, the center frequency can be changed to about 1860 MHz, about 1813 MHz, and about 1750 MHz. That is, with reference to about 1813 MHz, it was determined that the center frequency can be changed within a range of about ±3%. In this case, if elements connected with the ground potential, such as the capacitor C1, inductance L4, and the capacitor C7, are arranged such that their impedances are in a range from about 20Ω to about 100Ω, a loss is decreased.

In particular, the impedances of the elements inserted into the parallel arm connected with the ground potential are preferably in a range from about 20Ω to about 100Ω, for example. If the impedance values are within this range, good impedance matching is obtained with respect to the circuit connected to the upstream and downstream sides of the capacitor C1 or C7, or the inductance L4. Accordingly, an insertion loss is decreased.

Figure 37:
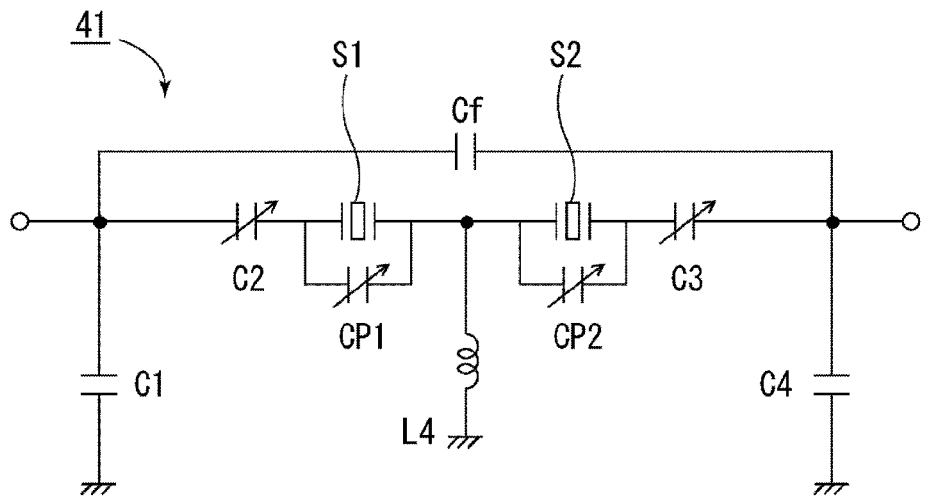
FIG. 37 is a circuit diagram of a tunable filter according to a third preferred embodiment of the present invention.

FIG. 37 is a circuit diagram of a tunable filter according to another preferred embodiment of the present invention. A tunable filter 41 in FIG. 37 is substantially similar to the tunable filter 31 in FIG. 34. A difference is that a variable capacitor CP1 connected in parallel with a series-arm resonator S1 and a variable capacitor CP2 connected in parallel with a series-arm resonator S2 are preferably provided.

Variable capacitors C2 and C3 connected in series with the series-arm S1 and S2 define first variable capacitors according to a preferred embodiment of the present invention. Also, variable capacitors CP1 and CP2 connected in parallel respectively with the series-arm resonators S1 and S2 define second variable capacitors according to a preferred embodiment of the present invention. In this preferred embodiment, the first variable capacitors C2 and C3 and the second variable capacitors CP1 and CP2 are preferably respectively connected with all the series-arm resonators S1 and S2. However, in preferred embodiments of the present invention, the first variable capacitor may preferably be connected in series with at least one surface acoustic wave resonator from among the plurality of surface acoustic wave resonators defining the series-arm resonators provided in the series arm. Similarly, the second variable capacitor may preferably be connected in parallel with at least one surface acoustic wave resonator. Also, a capacitor may be used instead of the inductance L4.

With this tunable filter 41, the center frequency can be changed without changing a pass band width and without an attenuation in a higher region with respect to the pass band being degraded. This will be described below with reference to FIGS. 36 and 38. A solid line in FIG. 36 indicates an impedance-frequency characteristic according to an example of a surface acoustic wave device according to a preferred embodiment of the present invention in which grooves in a LiNbO₃ substrate are filled with metal. A broken line indicates an impedance characteristic of a surface acoustic wave device in which an electrode is provided on LiNbO₃ for comparison. It was determined that the characteristic indicated by the solid line has an advantage in that the band between the resonant frequency and the anti-resonant frequency is wide as compared to the characteristic indicated by the broken line.

Figure 38:
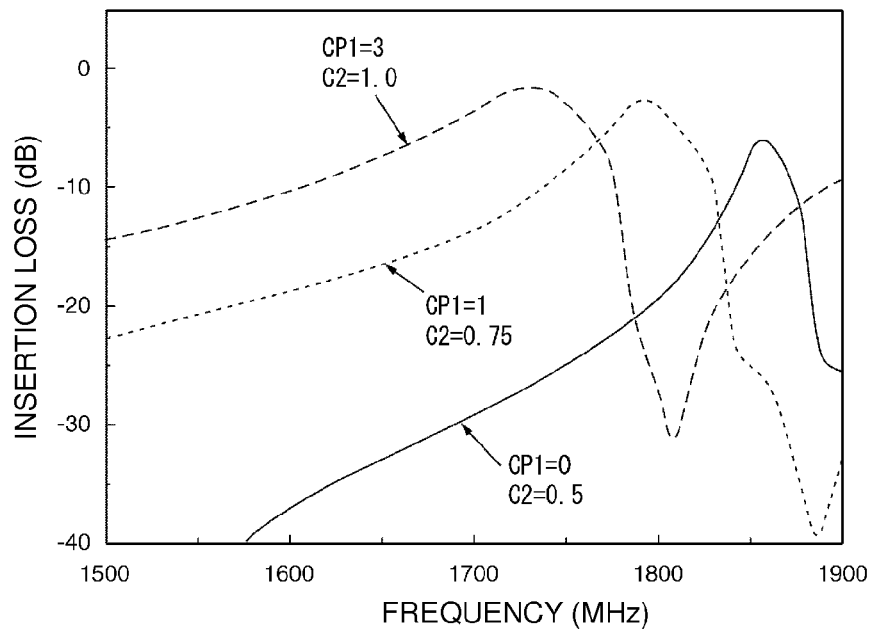
FIG. 38 is an illustration showing a change in filter characteristic of the tunable filter according to the third preferred embodiment of the present invention when the electrostatic capacities of variable capacitors C2 and C3 are equivalent to each other, the electrostatic capacities of variable capacitors CP1 and CP2 are equivalent to each other, and the electrostatic capacities of the variable capacitors C2 and C3, and CP1 and CP2 are changed.

In the tunable filter 41, when the surface acoustic wave devices including embedded-type IDT electrodes having the aforementioned resonant characteristics are used as the series-arm resonators S1 and S2, the capacities of the variable capacitors C2 and C3 are equivalent or substantially equivalent to each other, and the capacities of the variable capacitors CP1 and CP2 are equivalent or substantially equivalent to each other, FIG. 38 shows frequency characteristics when the electrostatic capacities are changed as shown in FIG. 38.

As shown in FIG. 38, when the electrostatic capacities of C2 and CP1 are changed to C2=about 0.5 pF and CP1=about 0 (CP1 is not connected), C2=about 0.75 and CP1=about 1.0 pF, and C2=about 1.0 pF and CP1=about 3.0 pF, the center frequency can be changed by about 7%, to about 1858 MHz, about 1798 MHz, and about 1733 MHz. The impedance value when the electrostatic capacities of the capacitors C1 and C4 are about 2.5 pF is about 35Ω at about 1800 MHz. This impedance value substantially matches an external impedance of about 50Ω. Thus, the insertion loss can be decreased. Also, an impedance of the inductance L4 (inductance value of about 4.5 nH) at a frequency around 1800 MHz is about 45Ω.

FIG. 37 is the circuit diagram of the tunable filter according to the present preferred embodiment of the present invention. The variable capacitor C2 is preferably connected in series with a parallel connection circuit of the variable capacitor CP1 and the series-arm resonator S1. Similarly, the variable capacitor C3 is preferably connected in series with a parallel connection circuit of the variable capacitor CP2 and the series-arm resonator S2.

Figure 51A:
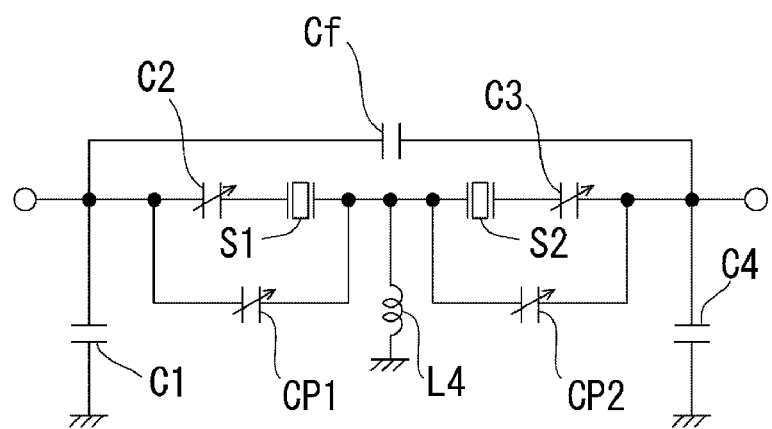
FIG. 51A is a circuit diagram of a tunable filter according to a modification of a preferred embodiment of the present invention.

As shown in FIG. 51A which is a modification of a preferred embodiment of the present invention, a variable capacitor CP1 may be connected in parallel with a series connection circuit of a series-arm resonator S1 and a variable capacitor C2. Similarly, a variable capacitor CP2 may be connected in parallel with a series connection circuit of a series-arm resonator S2 and a variable capacitor C3.

Figure 51B:
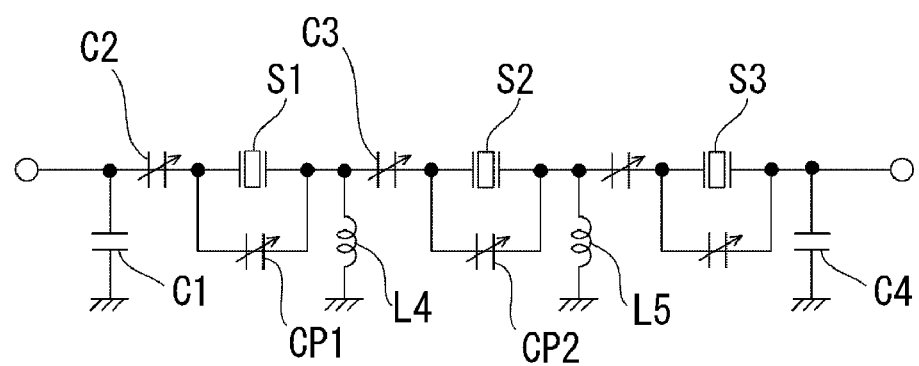
FIG. 51B is a circuit diagram of a tunable filter according to another modification of a preferred embodiment of the present invention, in which a circuit including a series arm having a series-arm resonator S3 and a parallel arm having an inductance L5 are additionally connected by cascading connection.
Figure 52:
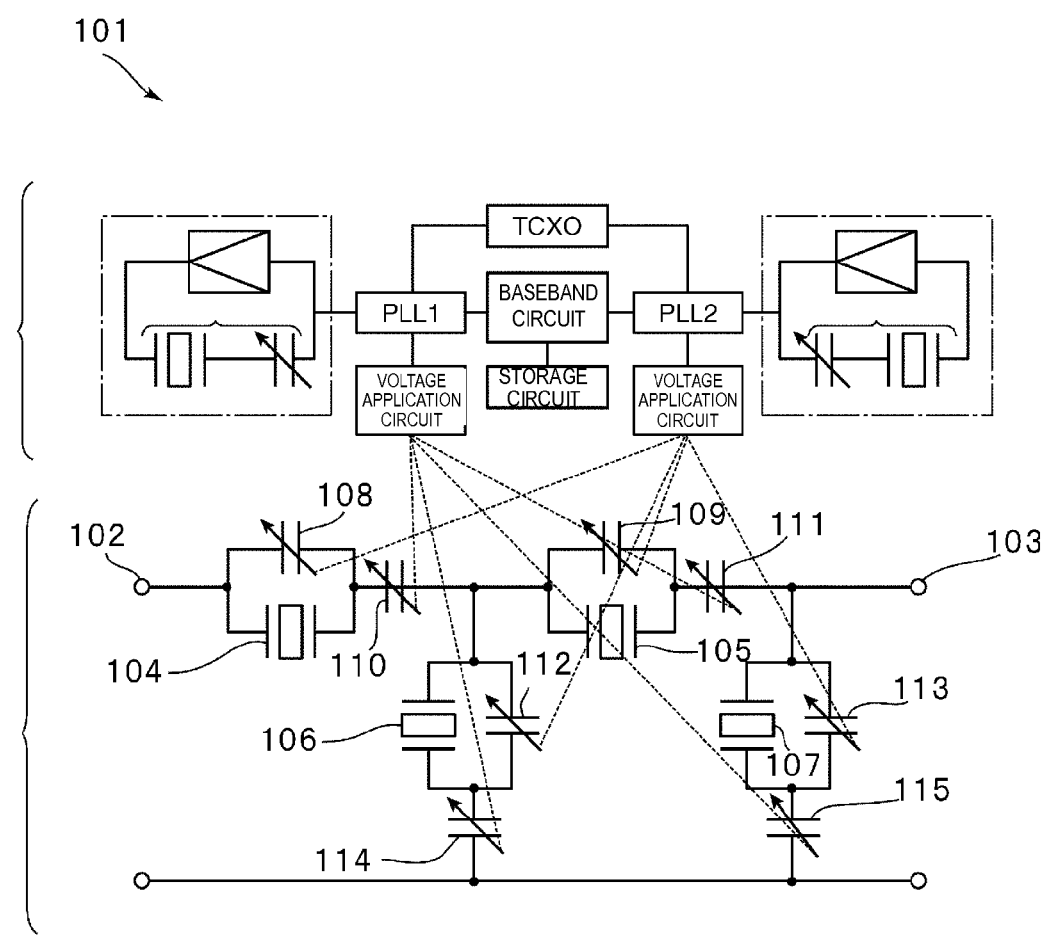
FIG. 52 is a circuit diagram of a tunable filter according to the related art.

FIG. 37 shows the tunable filter including the series-arm resonators S1 and S2 in the series arm. However, as shown in FIG. 51B which is another modification of a preferred embodiment of the present invention, a circuit including a series arm containing a series-arm resonator S3 and a parallel arm containing an inductance L5 may be additionally connected by cascading connection. Variable capacitors are connected in parallel or in series with S1, S2, and S3. However, some of the variable capacitors may be omitted. Also, an inductance L4 may be replaced with a capacitor.

While the surface acoustic wave resonator and the tunable filter in which the variable capacitor is connected in series with the surface acoustic wave resonator have been described in the above-described examples, one of the unique features of preferred embodiments of the present invention is the surface acoustic wave resonator used in the tunable filter. Therefore, the circuit configuration of the tunable filter is not particularly limited. That is, preferred embodiments of the present invention can be applied to a typical tunable filter in which variable capacitors are connected in series and/or in parallel with surface acoustic wave resonators.

Also, the structure of a variable capacitor is not particularly limited. A proper variable capacitor the electrostatic capacity of which can be changed mechanically or electrically may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A tunable filter, comprising:
a surface acoustic wave resonator including:
  a piezoelectric substrate made of LiNbO₃ with Euler angles of (0°, 80° to 130°, 0°) and including a recess provided in an upper surface thereof; and
  an IDT electrode including a metal material that is primarily made of at least a material selected from a group consisting of Au, Pt, W, Ta, Ag, Cu, Mo, and Ni and embedded in the recess; wherein
when $\lambda$ is a wavelength of a surface acoustic wave, a relationship among the metal from which the IDT electrode is primarily made, a lower limit of a film thickness of the electrode, and a duty is a relationship shown in Table 1, an upper limit of the film thickness of the electrode is a value shown in Table 1, and the duty is in a range from about 0.15 to about 0.85; and
a variable capacitor connected with the surface acoustic wave resonator:

TABLE 1

(X: Duty)

| Electrode | Lower limit of film thickness ($\lambda$) | Upper limit of film thickness ($\lambda$) |
|---|---|---|
| Au | $0.0381 - 0.0211X - 0.0222X^2$ | 0.25 |
| Pt | $0.0501 - 0.0445X - 0.0031X^2$ | 0.25 |
| W | $0.0748 - 0.0978X + 0.0444X^2$ | 0.25 |
| Ta | $0.0739 - 0.0789X + 0.0222X^2$ | 0.25 |
| Ag | $0.1287 - 0.1767X + 0.0667X^2$ | 0.25 |
| Cu | $0.1883 - 0.23X + 0.0667X^2$ | 0.25 |
| Mo | $0.1497 - 0.0990X$ | 0.25 |
| Ni | $0.22112 - 0.13613X + 0.0439X^2$ | 0.25. |

2. The tunable filter according to claim 1, wherein the relationship among the metal from which the IDT electrode is primarily made, the film thickness of the electrode, and the duty is a relationship shown in Table 3, and the upper limit of the film thickness of the electrode is a value shown in Table 3:

TABLE 3

(X: Duty)

| Electrode | Lower limit of film thickness ($\lambda$) | Upper limit of film thickness ($\lambda$) |
|---|---|---|
| Au | $0.0343 - 0.0190X - 0.0200X^2$ | 0.25 |
| Pt | $0.0451 - 0.0401X - 0.0028X^2$ | 0.25 |
| W | $0.0673 - 0.0880X + 0.040X^2$ | 0.25 |
| Ta | $0.0665 - 0.0710X + 0.020X^2$ | 0.25 |
| Ag | $0.1158 - 0.1590X + 0.060X^2$ | 0.25 |
| Cu | $0.1695 - 0.207X + 0.060X^2$ | 0.25 |
| Mo | $0.1347 - 0.0891X$ | 0.25 |
| Ni | $0.1997 - 0.1259X + 0.0358X^2$ | 0.25. |

3. The tunable filter according to claim 1, wherein
the surface acoustic wave resonator includes a plurality of surface acoustic wave resonators, and the plurality of surface acoustic wave resonators are connected in series between an input terminal and an output terminal;

the variable capacitor includes first and second variable capacitors, the first variable capacitor being connected in series with at least one of the plurality of surface acoustic wave resonators, the second variable capacitor being connected in parallel with at least one of the plurality of surface acoustic wave resonators; and the tunable filter further comprises:
an inductance connected between a node of the plurality of surface acoustic wave resonators and a ground; and
matching capacitors respectively connected between the input terminal and the ground and between the output terminal and the ground.

4. The tunable filter according to claim 3, wherein the matching capacitors and the inductance have impedances in a range from about 20Ω to about 100Ω.

5. A tunable filter, comprising:
a surface acoustic wave resonator including:
a piezoelectric substrate made of $LiNbO_3$ with Euler angles of (0°, 80° to 130°, 0°) and including a recess provided in an upper surface thereof; and
an IDT electrode including a metal material that is primarily made of at least a material selected from a group consisting of Au, Pt, W, Ta, Ag, Cu, Mo, and Ni and embedded in the recess; wherein
when $\lambda$ is a wavelength of a surface acoustic wave, a relationship among the metal from which the IDT electrode is primarily made, a lower limit of a film thickness of the electrode, and a duty is a relationship shown in Table 2, an upper limit of the film thickness of the electrode is a value shown in Table 2, and the duty is greater than about 0.5; and
a variable capacitor connected with the surface acoustic wave resonator:

TABLE 2

| | (X: Duty) | |
|---|---|---|
| Electrode | Lower limit of film thickness ($\lambda$) | Upper limit of film thickness ($\lambda$) |
| Au | $0.0381 - 0.0211X - 0.0222X^2$ | 0.25 |
| Pt | $0.0501 - 0.0445X - 0.0031X^2$ | 0.25 |
| W | $0.0748 - 0.0978X + 0.0444X^2$ | 0.25 |
| Ta | $0.0739 - 0.0789X + 0.0222X^2$ | 0.25 |
| Ag | $0.1287 - 0.1767X + 0.0667X^2$ | 0.25 |
| Cu | $0.1883 - 0.23X + 0.0667X^2$ | 0.25 |
| Mo | $0.1497 - 0.0990X$ | 0.25 |
| Ni | $0.22112 - 0.13613X + 0.0439X^2$ | 0.25. |

6. The tunable filter according to claim 5, wherein
the surface acoustic wave resonator includes a plurality of surface acoustic wave resonators, and the plurality of surface acoustic wave resonators are connected in series between an input terminal and an output terminal;
the variable capacitor includes first and second variable capacitors, the first variable capacitor being connected in series with at least one of the plurality of surface acoustic wave resonators, the second variable capacitor being connected in parallel with at least one of the plurality of surface acoustic wave resonators; and
the tunable filter further comprises:
an inductance connected between a node of the plurality of surface acoustic wave resonators and a ground; and
matching capacitors respectively connected between the input terminal and the ground and between the output terminal and the ground.

7. The tunable filter according to claim 6, wherein the matching capacitors and the inductance have impedances in a range from about 20Ω to about 100Ω.

8. A tunable filter, comprising:
a surface acoustic wave resonator including:
a piezoelectric substrate made of $LiNbO_3$ with Euler angles of (0°, 80° to 130°, 0°) and including a recess provided in an upper surface thereof; and
an IDT electrode in which Al or an alloy primarily made of Al is embedded in the recess; wherein
when $\lambda$ is a wavelength of a surface acoustic wave, a normalized film thickness H/$\lambda$ of the IDT electrode is in a range from about 0.036 to about 0.4, a relationship between an upper limit of a normalized film thickness of Al and a duty is preferably a relationship shown in Table 4, a lower limit of the normalized film thickness of Al is a value shown in Table 4, and a duty is less than about 0.5 or greater than about 0.5; and
a variable capacitor connected with the surface acoustic wave resonator:

TABLE 4

| (Y: Al film thickness, X: Duty) | | |
|---|---|---|
| Electrode | Lower limit | Upper limit |
| Al | 0.036 $\lambda$ | $Y = -0.9X + 0.766$. |

9. The tunable filter according to claim 8, wherein a relationship among the metal from which the IDT electrode is primarily made, the upper limit of the film thickness of the electrode, and the duty is a relationship shown in Table 5, and the lower limit of the film thickness of the electrode is a value shown in Table 5:

TABLE 5

| (Y: Al film thickness, X: Duty) | | |
|---|---|---|
| Electrode | Lower limit | Upper limit |
| Al | 0.036 $\lambda$ | $Y = -0.81X + 0.689$. |

10. The tunable filter according to claim 8, wherein
the surface acoustic wave resonator includes a plurality of surface acoustic wave resonators, and the plurality of surface acoustic wave resonators are connected in series between an input terminal and an output terminal;
the variable capacitor includes first and second variable capacitors, the first variable capacitor being connected in series with at least one of the plurality of surface acoustic wave resonators, the second variable capacitor being connected in parallel with at least one of the plurality of surface acoustic wave resonators; and
the tunable filter further comprises:
an inductance connected between a node of the plurality of surface acoustic wave resonators and a ground; and
matching capacitors respectively connected between the input terminal and the ground and between the output terminal and the ground.

11. The tunable filter according to claim 10, wherein the matching capacitors and the inductance have impedances in a range from about 20Ω to about 100Ω.

12. A tunable filter, comprising:
a surface acoustic wave resonator including:
a piezoelectric substrate made of $LiNbO_3$ with Euler angles of (0°, 80° to 130°, 0°) and including a recess provided in an upper surface; and an IDT electrode in which a metal material that is primarily made of at least a material selected from a group consisting of Au, Pt, W, Ta, Ag, Cu, Mo, and Ni is embedded in the recess; wherein
when $\lambda$ is a wavelength of a surface acoustic wave, a thickness $H/\lambda$ of the electrode that is primarily made of Au, Pt, W, or Ta is about 0.006 or less, a thickness $H/\lambda$ of the electrode that is primarily made of Ag is about 0.01 or less, or a thickness $H/\lambda$ of the electrode that is primarily made of Cu, Mo, or Ni is about 0.013 or less; and
a variable capacitor connected with the surface acoustic wave resonator.

13. The tunable filter according to claim 12, wherein
the surface acoustic wave resonator includes a plurality of surface acoustic wave resonators, and the plurality of surface acoustic wave resonators are connected in series between an input terminal and an output terminal;
the variable capacitor includes first and second variable capacitors, the first variable capacitor being connected in series with at least one of the plurality of surface acoustic wave resonators, the second variable capacitor being connected in parallel with at least one of the plurality of surface acoustic wave resonators; and
the tunable filter further comprises:
an inductance connected between a node of the plurality of surface acoustic wave resonators and a ground; and
matching capacitors respectively connected between the input terminal and the ground and between the output terminal and the ground.

14. The tunable filter according to claim 13, wherein the matching capacitors and the inductance have impedances in a range from about 20Ω to about 100Ω.

* * * * *